(12) United States Patent
Kabir et al.

(10) Patent No.: US 8,471,749 B2
(45) Date of Patent: Jun. 25, 2013

(54) COMPARATOR

(75) Inventors: Mohammad Nizam U Kabir, Tempe, AZ (US); Brandt Braswell, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 80 days.

(21) Appl. No.: 13/185,059

(22) Filed: Jul. 18, 2011

(65) Prior Publication Data
US 2013/0021189 A1 Jan. 24, 2013

(51) Int. Cl.
*H03M 1/12* (2006.01)

(52) U.S. Cl.
USPC ........... 341/155; 341/118; 341/120; 341/164; 341/165

(58) Field of Classification Search
USPC .......................... 341/118, 120, 155, 164, 165
See application file for complete search history.

(56) References Cited

U.S. PATENT DOCUMENTS

| | | | |
|---|---|---|---|
| 5,563,598 A * | 10/1996 | Hickling | 341/155 |
| 6,084,538 A * | 7/2000 | Kostelnik et al. | 341/120 |
| 6,198,420 B1 * | 3/2001 | Ryan et al. | 341/155 |
| 6,614,379 B2 * | 9/2003 | Lin et al. | 341/158 |
| 7,079,068 B2 | 7/2006 | Clement et al. | |
| 7,102,545 B2 * | 9/2006 | Choi | 341/56 |
| 7,372,307 B1 * | 5/2008 | Wu | 327/96 |
| 7,449,923 B2 | 11/2008 | Braswell et al. | |
| 7,843,370 B2 * | 11/2010 | Chen | 341/120 |
| 2003/0090300 A1 * | 5/2003 | Nix | 327/77 |
| 2007/0030190 A1 * | 2/2007 | Lee | 341/155 |
| 2009/0179787 A1 * | 7/2009 | Naka et al. | 341/155 |
| 2010/0164761 A1 * | 7/2010 | Wan et al. | 341/108 |
| 2011/0210878 A1 * | 9/2011 | Barrow | 341/135 |

OTHER PUBLICATIONS

Behzad Razavi, Bruce A. Wooley, Design Techniques for High-Speed, High-Resolution Comparators, IEEE Journal of Solid-State Circuits, vol. 27, No. 12, Dec. 1992.

(Continued)

*Primary Examiner* — Linh Nguyen
(74) *Attorney, Agent, or Firm* — Quarles & Brady LLP

(57) ABSTRACT

A comparator is provided. In one embodiment, a method of operating a comparator comprises providing a bias current (920); comparing an input signal and a reference signal to determine a difference signal and an inverted difference signal (930); latching the difference signal and the inverted difference signal to generate a first and second latched signals (950); generating a control signal using at least the first and second latched signals (970); and controlling the bias current in response to the control signal (980), wherein the comparing the input signal and the reference signal (930) is activated and deactivated in response to the controlling the bias current (980). In another embodiment, a comparator comprises a bias circuit (420) configured to provide a bias current; a comparator circuit (430) configured to determine a difference signal and an inverted difference signal by comparing an input signal and a reference signal, wherein the bias current is used to place the comparator circuit (430) in an active mode; a latch circuit (450) configured to latch the difference signal and the inverted difference signal to generate a first and second latched signals; a control circuit (470) configured to generate a control signal using at least the first and second latched signals; and a switch circuit (480) configured to use the control signal to control the bias current to place the comparator circuit (430) in an active mode and an inactive mode.

17 Claims, 9 Drawing Sheets

OTHER PUBLICATIONS

Gerhard Mitteregger, Christian Ebner, Stephen Mechnig, Thomas Blon, Christophe Holuigue, and Ernesto Romani, A 20-mW 640-MHz CMOS Continous-Time sigma delta ADC With 20-MHz Signal Bandwidth, 80-dB Dynamic Range and 12-bit ENOB, IEEE Journal of Solid-State Circuits, vol. 41, No. 12, Dec. 2006.

Mohammad Ranjbar, Arash Mehrabi, Omid Oliaei, and Frederic Carrez, A 3.1 mW Continuous-Time sigma delta Modulator With 5-Bit Successive approximation Quantizer for WCDMA, IEEE Journal of Solid-State Circuits, vol. 45, No. 8, Aug. 2010.

Lukas Dorrer, Franz Kuttner, Patrizia Greco, Patrick Torta, and Thomas Hartig, A 3-mW 74-dB SNR 2-MHz Continuous-Time Delta-Sigma ADC With a Tracking ADC Quantizer in 0.13-um CMOS , IEEE Journal of Solid-State Circuits, vol. 40, No. 12, Dec. 2005.

* cited by examiner

COMPARATOR

BACKGROUND

1. Field of Use

The present disclosure relates generally to electronic circuits, and more specifically, to a comparator.

2. Related Art

A type of comparator for use in, for instance, an analog-to-digital converter (ADC) or the like includes a comparator circuit and a latch circuit for outputting a digital signal in sequence with a clock signal. FIG. 1 provides an example of a comparator 100. In FIG. 1, the comparator 100 includes a supply voltage source node 101, a supply voltage source node 102, a constant current source circuit 110, a bias circuit 120, a comparator circuit 130, a current mirror circuit 140, a latch circuit 150, and a set-reset (SR) flip-flop circuit 160. Further, the comparator 100 includes an input node 103 and a reference node 105. In addition, the comparator 100 includes output nodes 107 and 108.

In FIG. 1, the constant current source circuit 110 provides a constant bias current to the bias circuit 120. The bias circuit 120 mirrors the constant bias current in providing a continuous, uninterrupted bias current to the comparator circuit 130, which places the comparator circuit 130 in an active mode. In this example, the comparator circuit 130 is a differential amplifier. The comparator circuit 130 compares an input signal at the input node 103 with a reference signal at the reference node 105 to provide a difference signal and an inverted difference signal. The current mirror circuit 140 operates by mirroring the difference signal and the inverted difference signal to the output nodes 107 and 108, respectively. The latch circuit 150 is used to latch the voltage levels at the output nodes 107 and 108 to generate a first and second latched signals. The latched signals are then stored by the SR flip-flop circuit 160.

In operation, if the clock signal is low at the gate node of the transistor 153, then the transistor 153 is in an inactive mode. Therefore, the latch circuit 150 is operated in a regenerate state. Thus, the latch circuit 150 latches the difference signal at the output node 107 and the inverted difference signal at the output node 108 to the voltage level at either the voltage supply source node 101 or the voltage supply source node 102. The held voltage levels on each of the output nodes 107 and 108 are input to and stored by the SR flip-flop circuit 160. For instance, if the voltage level of the signal at the input node 103 is greater than the voltage level of the signal at the reference node 105, then the latch circuit 150 during regenerate state will latch the voltage level on the output node 107 to the voltage supply source node 102 and will latch the voltage level on the output node 108 to the voltage supply source node 101. Thus, the SR flip-flop circuit 160 will store a high voltage level.

Similarly, if the voltage level of the signal at the input node 103 is less than the voltage level of the signal at the reference node 105, then the latch circuit 150 during regenerate state will latch the voltage level on the output node 107 to the voltage supply source node 101 and will hold the voltage level on the output node 108 to the voltage supply source node 102. Thus, the SR flip-flop circuit 160 will store a low voltage level. If the clock signal at the gate of the transistor 153 is at its high voltage level, then the transistor 153 is in an active mode. Therefore, the latch circuit 150 is in a reset state. Thus, the voltage level at each of the output nodes 107 and 108 rapidly approach the same voltage level.

FIG. 2 shows waveforms 200 useful for understanding the relationship between a clock signal 201, an output signal 211, an instantaneous current 221, and a bias current 231 in the comparator 100 shown in FIG. 1. The graphical illustration in its entirety is referred to by 200. In operation, when the clock signal 201 is at a high voltage level, the latch circuit 150 is in its reset state. During the reset state, the voltage levels on the output nodes 107 and 108, as referenced by 212 and 213, respectively, equalize to about the same voltage level, as referenced by 214, Similarly, when the clock signal 201 is at a low voltage level, the latch circuit 150 is in its regenerate state. During the regenerate state, the voltage levels on the output nodes 107 and 108 latch at either the voltage level on the voltage supply source node 101 or the voltage level on the voltage supply source node 102, as referenced by 215 and 216, respectively. The instantaneous current 221 is appreciable at the start of the regenerate state, However, the bias current 231 is appreciable, continuous, and substantially constant throughout the operation of the comparator 100. Therefore, the bias current 231 is a significant portion of the overall current consumed by the comparator 100.

BRIEF DESCRIPTION OF THE DRAWINGS

The present disclosure is illustrated by way of examples, embodiments and the like and is not limited by the accompanying figures, in which like reference numbers indicate similar elements, Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, where.

DETAILED DESCRIPTION

Figure 1:
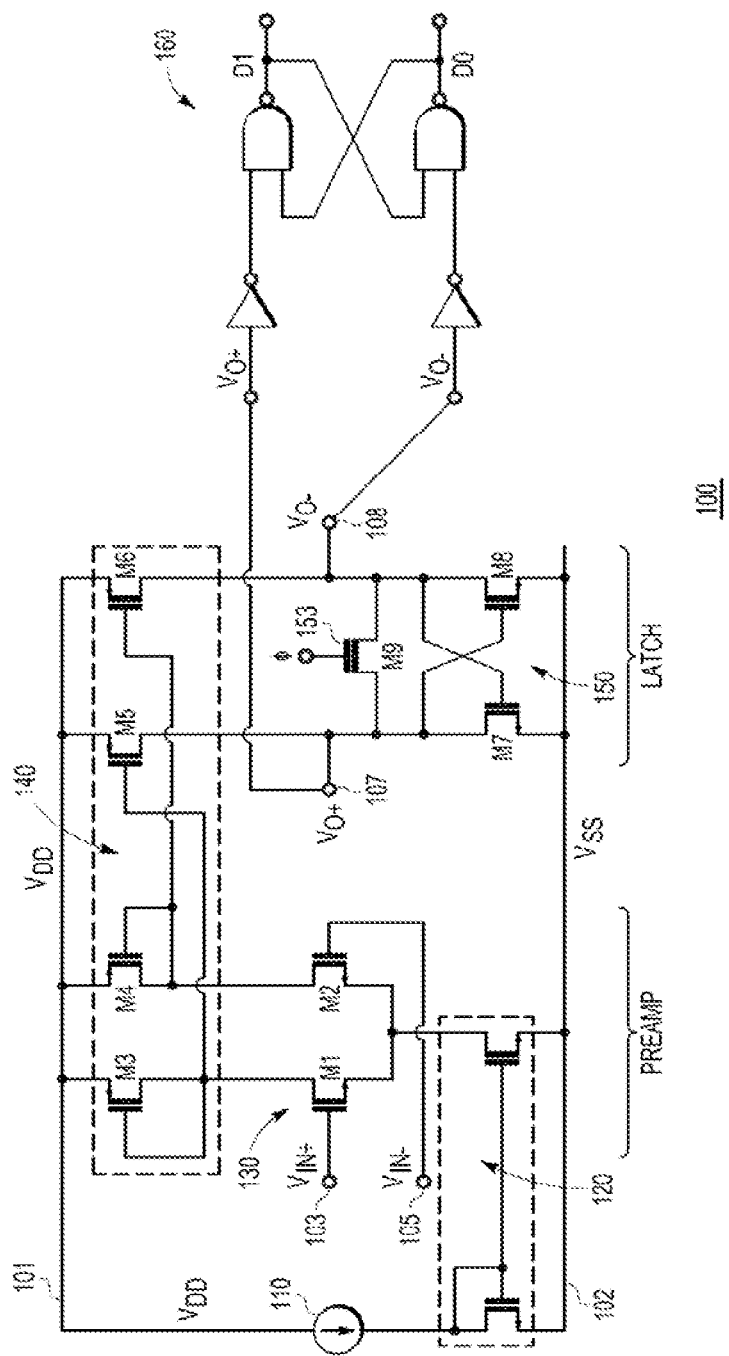
FIG. 1 illustrates an example of a prior art comparator.
Figure 2:
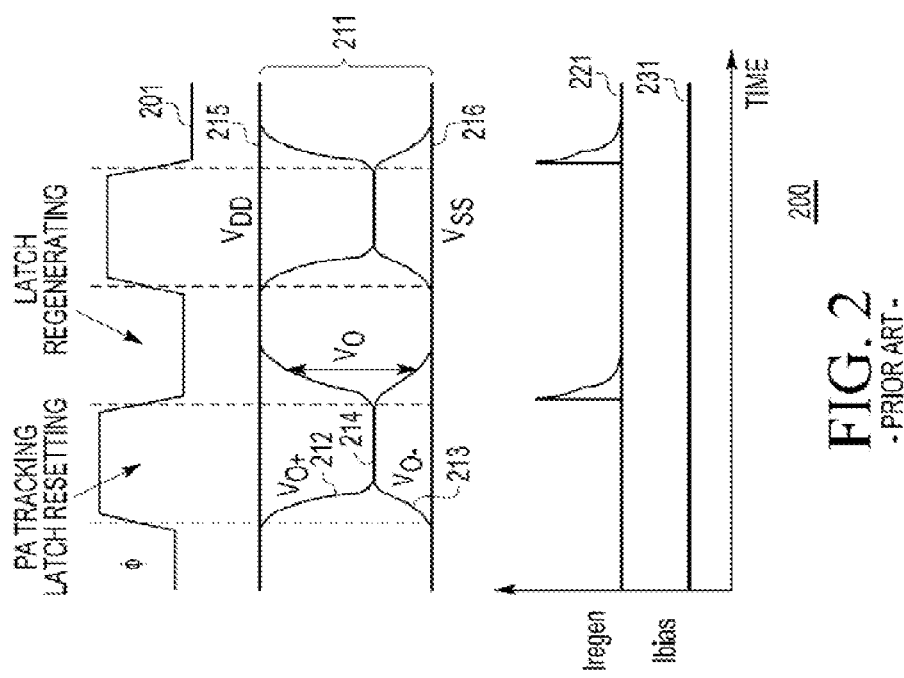
FIG. 2 shows waveforms useful for understanding the relationship between a clock signal, an output signal, an instantaneous current, and a bias current in the comparator shown in FIG. 1.

The following detailed description is merely illustrative in nature and is not intended to limit the present disclosure, or the application and uses of the present disclosure. Furthermore, there is no intention to be bound by any expressed or implied theory presented in the preceding technical field, background, or the following detailed description. The present disclosure provides various examples, embodiments and the like, which may be described herein in terms of functional or logical block elements. It should be recognized that such block elements may be realized by any number of hardware elements configured to perform the specified function. For instance, one embodiment of the present disclosure may employ various integrated circuit elements such as memory elements, clock elements, logic elements, analog elements, or the like, which may carry out a variety of functions under the control of a microprocessor or another control device. Further, it should be understood that all elements described herein may be implemented including in silicon or another semiconductor material, another implementation alternative, or any combination thereof.

It should be recognized that conventional techniques and configurations related to gain stages, amplifier design, transistor biasing, current mirror circuits, voltage comparison circuits, differential amplifier circuits, logic circuits, flip-flop circuits, latch circuits, analog-to-digital converter circuits, and other functional aspects of the circuits, elements and systems may not be described in detail herein. Furthermore, the connecting or coupling lines shown in the various figures contained herein are intended to represent example functional relationships, or connections or couplings between the various circuits or elements. It should be recognized that other alternatives, functional relationships, or connections or couplings may be present in a practical embodiment.

Throughout the specification and the claims, the following terms take a least the meanings explicitly associated herein, unless the context clearly dictates otherwise. The term "node" means any internal or external reference point, connection point, coupling point, junction, signal line, conductive element, or the like, at which a given signal, logic level, voltage, data pattern, data sequence, current, quantity, or the like is present. Furthermore, a plurality of nodes may be realized by one element and a plurality of signals may be multiplexed, modulated, or otherwise distinguished even though input or output at a common node. The term "circuit" means one or more elements, either active or passive, that are connected or coupled together to provide a desired function. The term "connected" means that one node, feature, circuit, or element is directly joined to or in communication with another node, feature, circuit, or element. The term "coupled" means that one node, feature, circuit, or element is directly or indirectly joined too/in communication with another node, feature, circuit, or element. Relational terms such as "first" and "second," and the like may be used solely to distinguish one entity or action from another entity or action without necessarily requiring or implying any actual such relationship or order between such entities or actions. The term "or" is intended to mean an inclusive "or" rather than an exclusive "or," Further, the terms "a," "an," and "the" are intended to mean one or more unless specified otherwise or clear from the context to be directed to a singular form.

Figure 3:
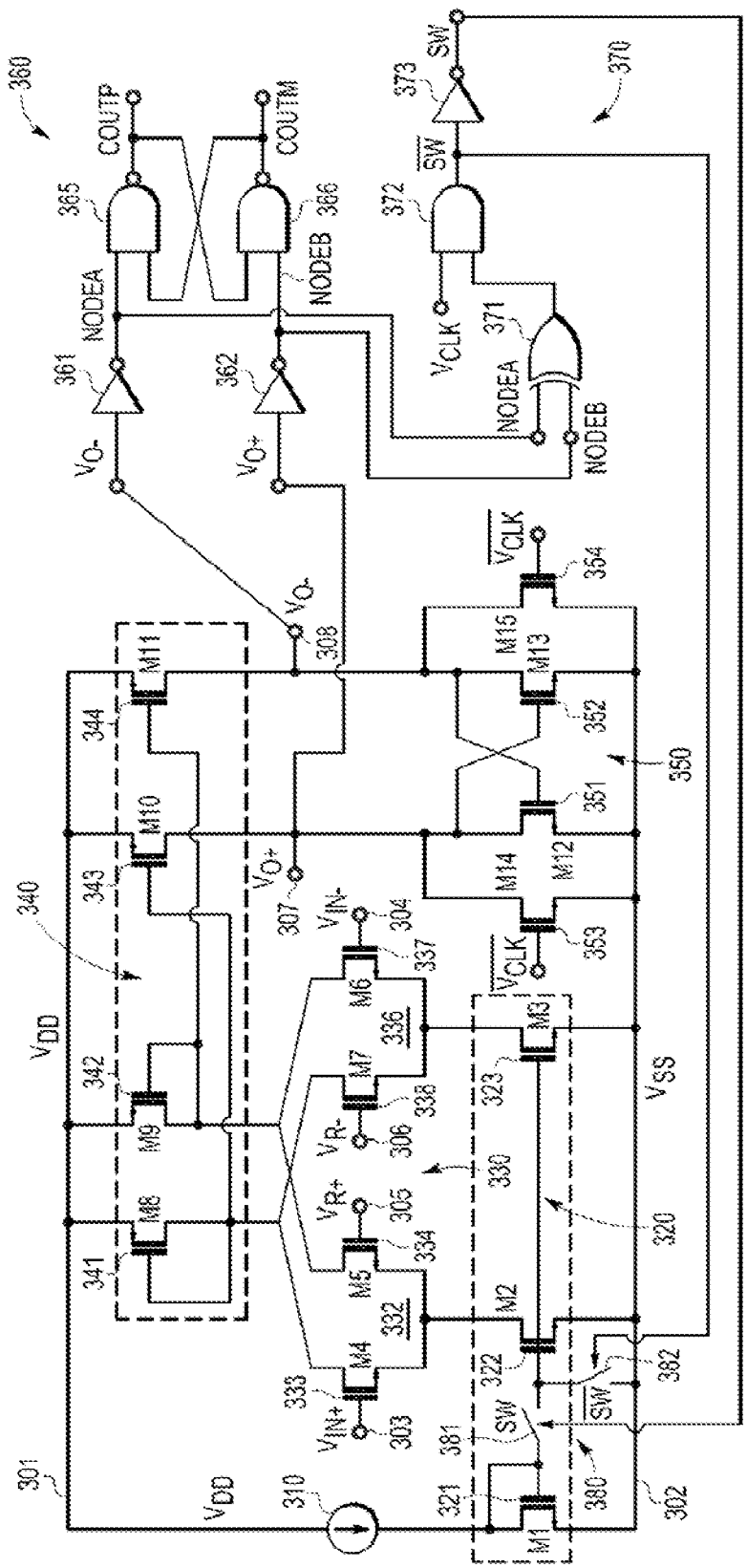
FIG. 3 illustrates a schematic representation of one embodiment of a comparator in accordance with various aspects set forth herein.

It is desirable to have a comparator that operates with more power efficiency while maintaining the same or similar performance. Furthermore, other desirable features and characteristics of the present disclosure will become apparent from the subsequent detailed description and claims, taken in conjunction with the accompanying figures and the foregoing technical field and background. FIG. 3 is a schematic representation of one embodiment of a comparator 300 in accordance with various aspects set forth herein. In FIG. 3, the comparator 300 can be configured to include a supply voltage source nodes 301 and 302, a constant current source circuit 310, a bias circuit 320, a comparator circuit 330, a current mirror circuit 340, a latch circuit 350, a memory circuit 360, a control circuit 370, and a switch circuit 380. Further, the comparator 300 can include an input nodes 303 and 304 that can be configured to receive a positive differential input signal and a negative differential input signal, as referenced in FIG. 3 by the terms "$V_{IN+}$" and "$V_{IN-}$," respectively.

Alternatively, the input nodes 303 and 304 can be configured to receive a single-ended input signal. A signal can be, for instance, an analog signal such as a continuous-time voltage signal, a digital signal such as a series or sequence of voltage samples, or both. Further, the comparator 300 can include a reference nodes 305 and 306 that can be configured to receive a positive differential reference signal and a negative differential reference signal, as referenced in FIG. 3 by the terms "$V_{R+}$" and "$V_{R-}$," respectively. Alternatively, the reference nodes 305 and 306 can be configured to receive a single-ended reference signal. Further, the reference nodes 305 and 306 can be configured to receive substantially the same reference signal. In one example, the input nodes 303 and 304 and the reference nodes 305 and 306 can receive differential, analog signals. In addition, the comparator 300 can include an output nodes 307 and 308 that can be configured to output a positive differential output signal and a negative differential output signal, as referenced in FIG. 3 by the terms "$V_{O+}$" and "$V_{O-}$," respectively. Alternatively, the output nodes 307 and 308 can be configured to output a single-ended output signal. The output nodes 307 and 308 can output an analog signal or a digital signal. It should be recognized that while this embodiment illustrates the use of differential inputs and outputs, any combination of differential and single-ended inputs and outputs can be used for the various circuits or elements in the comparator 300.

In the current embodiment, the supply voltage source node 301 can be configured to provide a first reference voltage level, referenced in FIG. 3 by the term "$V_{DD}$." Further, the supply voltage source node 302 can be configured to provide a second reference voltage level, referenced in FIG. 3 by the term "$V_{SS}$." For example, the supply voltage source node 301 can provide a positive 1.8 volt reference voltage level and the supply voltage source node 302 can provide a negative 1.8 volt reference voltage level. In another example, the supply voltage source node 301 can provide a positive five volt reference voltage level and the supply voltage source node 302 can provide a zero volt reference voltage level corresponding to a ground reference voltage level. In addition, the constant current source circuit 310 can be configured to provide a substantially constant bias current to the bias circuit 320. The constant current source circuit 310 can be implemented using, for instance, a voltage source in series with a resistor, a transistor-based active current source, a Zener-diode based active current source, a current mirror, another current source circuit, or any combination thereof. One end node of the constant current source circuit 310 can be coupled to the supply voltage source node 301 and the other end node can be coupled to the bias circuit 320.

In FIG. 3, the bias circuit 320 can be configured to include a transistors 321, 322 and 323. In this example, the transistors 321, 322 and 323 can each be an N-type metal-oxide semiconductor (NMOS) transistor. However, other types of transistors can be used such as a P-type metal-oxide semiconductor (PMOS) transistor, an NPN or PNP bipolar junction transistor (BJT), an N-type or P-type field-effect transistor (FET), another transistor type, or any combination thereof. The bias circuit 320 can be configured to provide a bias current to the comparator circuit 330 by, for instance, substantially mirroring the current flowing from the constant current source circuit 310 through the transistor 321 in the transistors 322 and 323. In this example, while the bias circuit 320 can be configured to use a current mirror circuit, other techniques or configurations can be used to perform the same or similar function. The transistor 321 can have its drain node coupled to its gate node and to the output node of the constant current source circuit 310—the drain node of the transistor 321 can also be referred to as the input node to the bias circuit 320. Further, the transistor 321 can have its gate node coupled via the switch circuit 380 to the gate nodes of the transistors 322 and 323. The transistors 322 and 323 can have their drain nodes coupled to the comparator circuit 330. The transistors 321, 322 and 323 can have their source nodes coupled to the supply voltage source node 302.

In the current embodiment, the comparator circuit 330 can be configured to include a differential amplifiers 332 and 336. A differential amplifier can combine the functions of an amplifier circuit and a voltage comparison circuit. An amplifier circuit can amplify a signal. A voltage comparison circuit can compare two signals to determine a difference signal. For example, a differential amplifier can amplify and compare two signals to provide a difference signal on an output node and an inverted difference signal on another output node. A person of ordinary skill in the art will recognize that an amplifier circuit and a voltage comparison circuit can be implemented using a differential amplifier. In another embodiment, the voltage comparison circuit can be combined with a latch circuit to form a latched comparator circuit. The differential amplifier 332 can be configured to include a transistors 333 and 334. Further, the differential amplifier 336 can be configured to include a transistors 337 and 338. In this example, the transistors 333, 334, 337 and 338 can each be an NMOS transistor. However, other types of transistors can be used such as a PMOS transistor, NPN or PNP N-type or P-type FET, another transistor type, or any combination thereof.

In this embodiment, the transistor 333 can have its gate node coupled to the input node 303, as referenced in FIG. 3 by the term "$V_{IN+}$." The transistor 333 can have its drain node coupled to the drain node of the transistor 338 and to the current mirror circuit 340. The transistor 334 can have its gate node coupled to the reference node 305, as referenced in FIG. 3 by the term "$V_{R+}$." The transistor 334 can have its drain node coupled to the drain node of the transistor 337 and to the current mirror circuit 340. The transistors 333 and 334 can have their source nodes coupled to the drain node of the transistor 322 of the bias circuit 320. The differential amplifier 332 can be configured to receive a bias current via the transistor 322 of the bias circuit 320. A person of ordinary skill in the art will recognize that a sufficient bias current can be used to operate a transistor including a transistor-based circuit or element in an active mode; otherwise, without a sufficient bias current, the transistor including the transistor-based circuit or element may be in an inactive mode. The differential amplifier 332 can compare the positive differential input signal at the input node 303 and the positive differential reference signal at the reference node 305 to provide a first difference signal ($V_{IN+}-V_{R+}$) at the drain node of the transistor 333 and an inverted first difference signal ($-(V_{IN+}-V_{R+})$) at the drain node of the transistor 334. The first difference signal and the inverted first difference signal can each be, for instance, an analog voltage signal.

Similarly, the transistor 337 can have its gate node coupled to the input node 304, as referenced in FIG. 3 by the term "$V_{IN-}$." The transistor 337 can have its drain node coupled to the drain node of the transistor 334 and to the current mirror circuit 340. The transistor 338 can have its gate node coupled to the reference node 306, as referenced in FIG. 3 by the term "$V_{R-}$." The transistor 338 can have its drain node coupled to the drain node of the transistor 333 and to the current mirror circuit 340. The transistors 337 and 338 can have their source nodes coupled to the drain node of the transistor 323 of the bias circuit 320. The differential amplifier 336 can be configured to receive a bias current via the transistor 323 of the bias circuit 320. The differential amplifier 336 can compare the negative differential input signal at the input node 304 and the negative differential reference signal the reference node 306 to provide a second difference signal ($V_{IN-}-V_{R-}$) at the drain node of the transistor 337 and an inverted second difference signal ($-(V_{IN-}-V_{R-})$) at the drain node of the transistor 338. The second difference signal and the inverted second difference signal can each be, for instance, an analog voltage signal.

The first difference signal at the drain node of the transistor 333 can be combined with the inverted second difference signal at the drain node of the transistor 338 to form a difference signal ($V_{IN+}-V_{R+})-(V_{IN-}-V_{R-}$). Further, the second difference signal at the drain node of the transistor 337 can be combined with the inverted first difference signal at the drain node of the transistor 334 to form an inverted difference signal ($-(V_{IN+}-V_{R+})+(V_{IN-}-V_{R-})$). The difference signal and inverted difference signal can each be, for instance, an analog voltage signal.

In this embodiment, the current mirror circuit 340 can be configured to include a transistors 341, 342, 343 and 344. In this example, the transistors 341, 342, 343 and 344 can each be a PMOS transistor. However, other types of transistors can be used such as a NMOS transistor, NPN or PNP BJT, N-type or P-type FET, other transistor type, or any combination thereof. The current mirror circuit 340 can be configured to operate by substantially mirroring the current flowing through the transistor 341 in the transistor 343 and by substantially mirroring the current flowing through the transistor 342 in the transistor 344. In this example, the difference signal and inverted difference signal output from the comparator circuit 330 can each be substantially mirrored by the current mirror circuit 340 to the output nodes 307 and 308, respectively. It should be recognized that the current mirror circuit 340 can be configured as two separate current mirrors—a first current mirror can include the transistors 341 and 343, and a second current mirror can include the transistors 342 and 344. While the current mirror circuit 340 can be configured to use two current mirror circuits, other techniques or configurations can be used to perform the same or similar function.

In FIG. 3, the transistor 341 can have its drain node coupled to its gate node, the drain nodes of the transistors 333 and 338 of the comparator circuit 330, and the gate node of the transistor 343. The transistor 342 can have its drain node coupled to its gate node, the drain nodes of the transistors 334 and 337 of the comparator circuit 330, and the gate node of the transistor 344. The transistor 343 can have its drain node coupled to the output node 307, the latch circuit 350, and the memory circuit 360. The transistor 344 can have its drain node coupled to the output node 308, the latch circuit 350, and the memory circuit 360. The transistors 341, 342, 343 and 344 can have their source nodes coupled to the supply voltage source node 301.

In this embodiment, the latch circuit 350 can be configured to include a transistors 351, 352, 353 and 354, used to latch the difference signal and inverted difference signal at the output nodes 307 and 308 to generate a first and second latched signals, respectively. During the regenerate state of the latch circuit 350, the difference signal and inverted difference signal at the output nodes 307 and 308 can latch to different voltage levels on either of the voltage supply source nodes 301 and 302. Alternatively, during the reset state of the latch circuit 350, the voltage levels on the output nodes 307 and 308 can latch to the same voltage level on either of the voltage supply source nodes 301 and 302. In this example, the transistors 351, 352, 353 and 354 can each be an NMOS transistor. However, other types of transistors can be used such as a PMOS transistor, NPN or PNP BJT, N-type or P-type FET, other transistor type, or any combination thereof. The transistors 351 and 352 can be configured as inverters by connecting the input of one transistor to the output of the other transistor. The transistor 351 can have its drain node coupled to the gate node of the transistor 352, the drain node of the transistor 353, the output node 307, and the drain node of the transistor 343 of the current mirror circuit 340. The transistor 352 can have its drain node coupled to the gate node of the transistor 351, the drain node of the transistor 354, the output node 308, and the drain node of the transistor 344 of the current mirror circuit 340. Further, an inverted clock signal node can provide an inverted clock signal, as referenced in FIG. 3 by the term "$\overline{V_{CLK}}$," and can be coupled to the gate of the transistors 353 and 354. Thus, the transistors 353 and 354 can be used to operate the transistors 351 and 352 in synchronization with an inverted clock signal.

In FIG. 3, the memory circuit 360 can be configured to include an inverter logic gates 361 and 362 and a not AND (NAND) logic gates 365 and 366 to form an SR NAND latch circuit. In other embodiments, the memory circuit 360 can be a flip-flop, latch. SR not OR (NOR) latch, JK latch, gated SR latch, gated D latch, Earle latch, D flip-flop, T flip-flop, JK flip-flop, RS flip-flop, random access memory (RAM), another memory circuit or element, or any combination thereof. The inputs to the inverter logic gates 361 and 362 can be the second and first latched signals from the output nodes 308 and 307, respectively. The outputs from the inverter logic gates 361 and 362 are an inverted second latched signal and an inverted first latched signal, referenced in FIG. 3 by the terms "NODEA" and "NODEB," respectively. The outputs from the inverter logic gates 361 and 362 can be input to the NAND logic gates 365 and 366, respectively. Further, the NAND logic gates 365 and 366 can be cross-coupled by connecting each output of the NAND logic gate to the input of the other NAND logic gate. The outputs of the NAND logic gates 365 and 366 are a first and second NAND output signals, referenced in FIG. 3 by the terms "COUTP" and "COUTM," respectively.

In FIG. 3, the control circuit 370 can be configured to include an exclusive OR (XOR) logic gate 371, an AND logic gate 372, and an inverter logic gate 373. The control circuit 370 can generate a control signal that is used to control a bias current provided by the bias circuit 320 to any of the circuits or elements associated with the comparator 300. For example, the control circuit 370 can generate a control signal to control a bias current provided by the bias circuit 320 to place the amplifier circuit, the voltage comparison circuit, the associated comparator circuit 330, or any combination thereof in an active mode, inactive mode, or both. The inputs to the XOR logic gate 371 can be the inverted second latched signal and the inverted first latched signal from the inverter logic gates 361 and 362 of the memory circuit 360, referenced in FIG. 3 by the terms "NODEA" and "NODEB," respectively. The output node of the XOR logic gate 371 can be coupled to the first input node of the AND logic gate 372, A clock signal node can provide a clock signal, referenced in FIG. 3 by the term "$V_{CLK}$," and can be coupled to the input node of the AND logic gate 372. The output node of the AND logic gate 372 can provide an inverted control signal, referenced in FIG. 3 by the term "$\overline{SW}$." Further, the inverted control signal can be input to the inverter logic gate 373 to form a control signal, referenced in FIG. 3 by the term "SW." The control signal, inverted control signal, or both can be input to the switch circuit 380.

In another embodiment, the control circuit 370 can be configured to include an XOR logic gate 371 and an inverter logic gate 373. The inputs to the XOR logic gate 371 can be the inverted second latched signal and the inverted first latched signal from the inverter logic gates 361 and 362 of the memory circuit 360, referenced in FIG. 3 by the terms "NODEA" and "NODEB," respectively. The output node of the XOR logic gate 371 can provide an inverted control signal, referenced in FIG. 3 by the term "$\overline{SW}$." Further, the inverted control signal can be input to the inverter logic gate 373 to form a control signal, referenced in FIG. 3 by the term "SW." The control signal, inverted control signal, or both can be input to the switch circuit 380.

In the current embodiment, the switch circuit 380 can be configured to include a switch 381 and a switch 382. A switch is a circuit or element that can be switched to, for instance, interrupt a current or divert the current from one circuit or element to another circuit or element. A switch can be composed of a transistor, a logic gate, another circuit or element, or any combination thereof. The switch circuit 380 can be switched to place the amplifier circuit, the voltage comparison circuit, the associated comparator circuit 330, another circuit or element, or any combination thereof in an active mode, inactive mode, or both by controlling its bias current provided by the bias circuit 320. One end node of the switch 381 can be coupled to the gate node and the drain node of the transistor 321 of the bias circuit 320. The other end node of the switch 381 can be coupled to the gate nodes of the transistors 322 and 323 of the bias circuit 320. The switch 381 can be controlled by the control signal provided at the output node of the inverter logic gate 373 of the control circuit 370, referenced in FIG. 3 by the term "SW." One end node of the switch 382 can be coupled to the other end node of the switch 381 and to the gate nodes of the transistors 322 and 323 of the bias circuit 320. The other end of the switch 382 can be coupled to the voltage supply source node 302. The switch 382 can be controlled by the control signal provided at the output node of the AND logic gate 372 of the control circuit 370, as referenced in FIG. 3 by the term "$\overline{SW}$."

For example, a control signal with a high voltage level, as generated by the control circuit 370, can close the switch 381 and can open the switch 382. Thus, the bias circuit 320 can substantially mirror the current generated by the constant current source circuit 310 in providing a sufficient bias current for the amplifier circuit, the voltage comparison circuit, the associated comparator circuit 330, or any combination thereof, placing such circuit in an active mode. Alternatively, a control signal with a low voltage level can, as generated by the control circuit 370, can open the switch 381 and can close the switch 382. Thus, the bias circuit 320 does not provide a sufficient bias current for the amplifier circuit, the voltage comparison circuit, the associated comparator circuit 330, or any combination thereof, placing such circuit in an inactive mode.

In another example, the constant current provided by the constant current source circuit 310 can be mirrored by the bias circuit 320 in providing a sufficient bias current to the comparator circuit 330 by switching the switch 381 in response to the control signal to couple the gate node of the transistor 321 with the gate nodes of the transistors 322 and 323, and by switching the switch 382 in response to the inverse of said control signal to decouple the gate nodes of the transistors 322 and 323 from the voltage supply source node 302. Alternatively, the mirroring of the constant current by the bias circuit 320 can be disabled by switching the switch 381 in response to the control signal to decouple the gate node of the transistor 321 from the gate nodes of the transistors 322 and 323, and by switching the switch 382 in response to the inverse of said control signal to couple the gate nodes of the transistors 322 and 323 with the voltage supply source node 302.

In operation, if the inverted clock signal is high ($\overline{V_{CLK}}$=1) at the gate nodes of the transistors 353 and 354, then the latch circuit 350 is operated in a regenerate state. Thus, the latch circuit 350 latches the difference signal at the output node 307 and the inverted difference signal at the output node 308 to the voltage level at either the voltage supply source node 301 or the voltage supply source node 302 resulting in a first and second latched signals, respectively. The first and second latched signals at the output nodes 307 and 308 are input to and stored by the memory circuit 360.

For example, if the voltage level at the input node 303 is greater than the voltage level at the reference node 305 ($V_{IN+}$>$V_{R+}$) and the voltage level at the input node 304 is less than the voltage level at the reference node 306 ($V_{IN-}$<$V_{R-}$), then the latch circuit 350 during regenerate state will latch the voltage level on the output node 307 to the voltage supply source node 302 ($V_{O+} \approx V_{SS}$) and will latch the voltage level on the output node 308 to the voltage supply source node 301 ($V_{O-} \approx V_{DD}$). However, if the voltage level at the input node 303 is less than the voltage level of the signal at the reference node 305 ($V_{IN+}$<$V_{R+}$) and the voltage level at the input node 304 is greater than the voltage level at the reference node 306 $V_{IN-}$>$V_{R-}$, then the latch circuit 350 during regenerate state will latch the voltage level on the output node 307 to the voltage supply source node 301 ($V_{O+} \approx V_{DD}$) and will latch the voltage level on the output node 308 to the voltage supply source node 302 ($V_{O-} \approx V_{SS}$).

Further, the memory circuit 360 inverts the second and first latched signals using the inverter logic gates 361 and 362 to generate the inverted signals (NODEA=0 and NODEB=1), respectively. Thus, the memory circuit 360 will store a high digital signal (COUTP=1). The control circuit 370 applies a logical XOR operation to the inverted first latched signal and the inverted second latched signal using the XOR logic gate 371. The control circuit 370 then applies a logical AND operation to the output of the XOR logic gate 371 and the clock signal, as referenced in FIG. 3 by the term "$V_{CLK}$," using the AND logic gate 372 to generate an inverted switch signal, as referenced in FIG. 3 by the term "$\overline{SW}$." The control circuit 370 then inverts the inverted switch signal using the inverter logic gate 373 to generate a switch signal, as referenced in FIG. 3 by the term "SW." It should be recognized that the inverted first latched signal and the inverted second latched signal at the input of the XOR logic gate 371 are inverses of each other (NODEA∝NODEB). Thus, the output of the XOR logic gate 371 is a high voltage signal. Therefore, the AND logic gate 372 generates a high voltage level for the inverted switch signal ($\overline{SW}$=1) while the output of the XOR logic gate 371 is a high voltage signal and the clock signal is a high voltage level ($V_{CLK}$=1), Further, the inverter logic gate 372 generates a low voltage level for the switch signal (SW=0).

Alternatively, if the inverted clock signal is low ($\overline{V_{CLK}}$=0), the latch circuit 350 is operated in a reset state. Thus, the latch circuit 350 rapidly settles to about the same voltage level for the first and second latched signals at the output node 307 and the output node 308, respectively. It should be recognized that the inverted first latched signal and the inverted second latched signal at the input of the XOR logic gate 371 are about the same voltage level (NODEA≈NODEB). Thus, the output of the XOR logic gate 371 is a low voltage signal. Therefore, the AND logic gate 372 generates a low voltage level for the inverted switch signal ($\overline{SW}$=0) while the output of the XOR logic gate 371 is a low voltage signal or the clock signal is a low voltage level ($V_{CLK}$=0). Further, the inverter logic gate 372 generates a high voltage level for the switch signal (SW=1).

In addition, the switch signal, as referenced in FIG. 3 by the term "SW," and the inverted switch signal, as referenced in FIG. 3 by the term "$\overline{SW}$," control the switch circuit 380. When the switch signal is high (SW=1) and the inverted switch signal is low ($\overline{SW}$=0), the switch 381 is closed and the switch 382 is open; thus, the gate of the transistor 321 is coupled to the gates of the transistors 322 and 323, and the gates of the transistors 322 and 323 are decoupled from the supply voltage source node 382. While in this state, the bias circuit 320 can provide a bias current to the comparator circuit 330 by substantially mirroring the bias current from the constant current source circuit 310 to the comparator circuit 330. Therefore, the comparator circuit 330 is in an active mode resulting in the use of more bias current.

However, when the switch signal is low (SW=0) and the inverted switch signal is high ($\overline{SW}$=1), the switch 381 is open and the switch 382 is closed; thus, the gate of the transistor 321 is decoupled from the gates of the transistors 322 and 323, and the gates of the transistors 322 and 323 are coupled to the voltage supply source node 302. While in this state, the transistors 322 and 323 are in an inactive mode and unable to mirror the constant current. Thus, the bias circuit 320 cannot provide a sufficient bias current to the comparator circuit 330 to place it in an active mode. Therefore, the comparator circuit 330 is in an inactive mode resulting in the use of less bias current.

Figure 4:
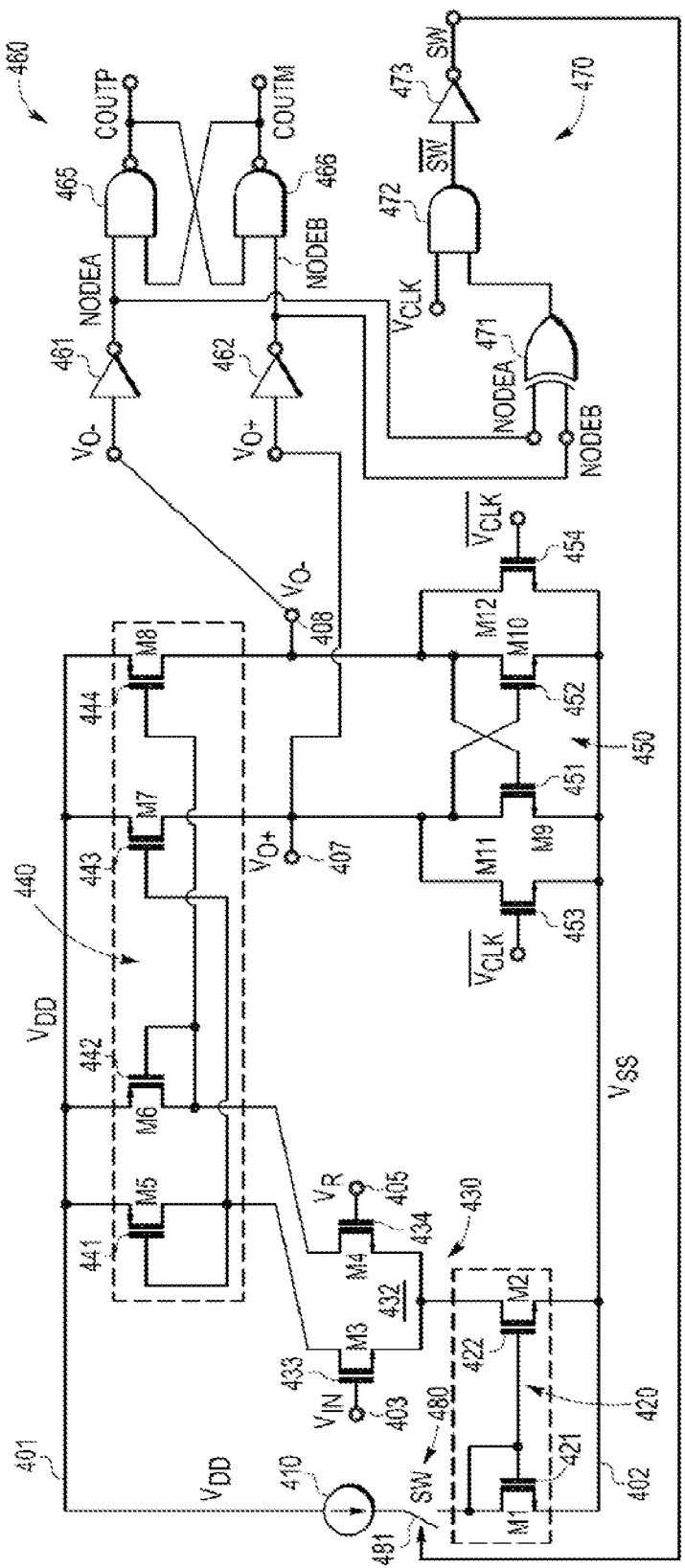
FIG. 4 illustrates a schematic representation of another embodiment of a comparator in accordance with various aspects set forth herein.

FIG. 4 illustrates a schematic representation of another embodiment of a comparator 400 in accordance with various aspects set forth herein. In FIG. 4, the comparator 400 can be configured to include a supply voltage source node 401, a supply voltage source node 402, a constant current source circuit 410, a bias circuit 420, a comparator circuit 430, a current mirror circuit 440, a latch circuit 450, a memory circuit 460, a control circuit 470, and a switch circuit 480. Further, the comparator 400 can include an input node 403 that can be configured to receive a single-ended input signal, as referenced in FIG. 4 by the terms "$V_{IN}$." Further, the comparator 400 can include a reference node 405 that can be configured to receive a single-ended reference signal, as referenced in FIG. 4 by the terms "$V_R$." For example, the input node 403 and the reference node 405 can receive single-ended analog signals. In addition, the comparator 400 can include an output nodes 407 and 408 that can be configured to output a positive differential output signal and a negative differential output signal, as referenced in FIG. 4 by the terms "$V_{O+}$" and "$V_{O-}$," respectively. Alternatively, the output nodes 407 and 408 can be configured to output a single-ended output signal. The output nodes 407 and 408 can output an analog signal or a digital signal. It should he recognized that while this embodiment illustrates the use of single-ended inputs and differential outputs, any combination of differential and single-ended inputs and outputs can be used for the various circuits or elements in the combiner 400.

In the current embodiment, the supply voltage source node 401 can be configured to provide a first reference voltage level, referenced in FIG. 4 by the term "$V_{DD}$." Further, the supply voltage source node 402 can be configured to provide a second reference voltage level, referenced in FIG. 4 by the term "$V_{SS}$." For example, the supply voltage source node 401 can provide a positive three volt reference voltage level and the supply voltage source node 402 can provide a zero volt reference voltage level corresponding to a ground reference voltage level. In addition, the constant current source circuit 410 can be configured to provide a substantially constant bias current to the bias circuit 420. The constant current source circuit 410 can be implemented using, for instance, a voltage source in series with a resistor, a transistor-based active current source, a Zener-diode based active current source, a current mirror, another current source circuit, or any combination thereof. One end node of the constant current source circuit 410 can be coupled to the supply voltage source node 401 and the other end node can be coupled to the bias circuit 420.

In this embodiment, the bias circuit 420 can be configured to include a transistors 421 and 422. In this example, the transistors 421 and 422 can each be an NMOS transistor. However, other types of transistors can be used such as a PMOS transistor, an NPN or PNP BJT, an N-type or P-type FET, another transistor type, or any combination thereof. The bias circuit 420 can be configured to provide a bias current to the comparator circuit 430 by, for instance, substantially mirroring the current flowing from the constant current source circuit 410 through the transistor 421 in the transistor 422. In this example, while the bias circuit 420 can be configured to use a current mirror circuit, other techniques or configurations can be used to perform the same or similar function. The transistor 421 can have its drain node coupled to its gate node and to the output node of the constant current source circuit 410—the drain node of the transistor 421 can also be referred to as the input node to the bias circuit 420. Further, the transistor 421 can have its gate node coupled via the switch circuit 480 to the gate node of the transistor 422. The transistor 422 can have its drain node coupled to the comparator circuit 430. The transistors 421 and 422 can have their source nodes coupled to the supply voltage source node 402.

In FIG. 4, the comparator circuit 430 can be configured to include a differential amplifier 432. The differential amplifier 432 can be configured to include a transistors 433 and 434. In this example, the transistors 433 and 434 can each be an NMOS transistor. However, other types of transistors can be used such as a PMOS transistor, NPN or PNP BJT, N-type or P-type FET, another transistor type, or any combination thereof. The transistor 433 can have its gate node coupled to the input node 403, as referenced in FIG. 4 by the term "$V_{IN}$." The transistor 433 can have its drain node coupled to the current mirror circuit 440. The transistor 434 can have its gate node coupled to the reference node 405, as referenced in FIG. 4 by the term "$V_R$." The transistor 434 can have its drain node coupled to the current mirror circuit 440. The transistors 433 and 434 can have their source nodes coupled to the drain node of the transistor 422 of the bias circuit 420. The differential amplifier 432 can be configured to receive a bias current via the transistor 422 of the bias circuit 420. The differential amplifier 432 can compare the input signal at the input node 403 and the reference signal at the reference node 405 to provide a difference signal ($V_{IN}$–$V_R$) at the drain node of the transistor 433 and an inverted difference signal (–($V_{IN}$–$V_R$)) at the drain node of the transistor 434. The difference signal and the inverted difference signal can each be, for instance, an analog voltage signal.

In the current embodiment, the current mirror circuit 440 can be configured to include a transistors 441, 442, 443 and 444. In this example, the transistors 441, 442, 443 and 444 can each be a PMOS transistor. However, other types of transistors can be used such as a NMOS transistor, NPN or PNP BJT, N-type or P-type FET, other transistor type, or any combination thereof. The current mirror circuit 440 can be configured to operate by substantially mirroring the current flowing through the transistor 441 in the transistor 443 and by substantially mirroring the current flowing through the transistor 442 in the transistor 444. In this example, the difference signal and the inverted difference signal output from the comparator circuit 430 can each be substantially mirrored by the current mirror circuit 440 to the output nodes 407 and 408, respectively. It should be recognized that the current mirror circuit 440 can be configured as two separate current mirrors—a first current mirror can include the transistors 441 and 443, and a second current mirror can include the transistors 442 and 444. While the current mirror circuit 440 can be configured to use two current mirror circuits, other techniques or configurations can be used to perform the same or similar function.

In FIG. 4, the transistor 441 can have its drain node coupled to its gate node, the drain node of the transistor 433 of the comparator circuit 430, and the gate node of the transistor 443. The transistor 442 can have its drain node coupled to its gate node, the drain node of the transistor 434 of the comparator circuit 430, and the gate node of the transistor 444. The transistor 443 can have its drain node coupled to the output node 407, the latch circuit 450, and the memory circuit 460. The transistor 444 can have its drain node coupled to the output node 408, the latch circuit 450, and the memory circuit 460. The transistors 441, 442, 443 and 444 can have their source nodes coupled to the supply voltage source node 401.

In this embodiment, the latch circuit 450 can be configured to include a transistors 451, 452, 453 and 454 used to latch the difference signal and the inverted difference signal at the output nodes 407 and 408 to generate a first and second latched signals, respectively. During the regenerate state of the latch circuit 450, the difference signal and the inverted difference signal at the output nodes 407 and 408 can latch to different voltage levels on either of the voltage supply source nodes 401 and 402. Alternatively, during the reset state of the latch circuit 450, the voltage levels on the output nodes 407 and 408 can latch to the same voltage level on either of the voltage supply source nodes 401 and 402. In this example, the transistors 451, 452, 453 and 454 can each be an NMOS transistor. However, other types of transistors can be used such as a PMOS transistor, NPN or PNP BJT, N-type or P-type FET, other transistor type, or any combination thereof. The transistors 451 and 452 can be configured as inverters by connecting the input of one transistor to the output of the other transistor. The transistor 451 can have its drain node coupled to the gate node of the transistor 452, the drain node of the transistor 453, the output node 407, and the drain node of the transistor 443 of the current mirror circuit 440. The transistor 452 can have its drain node coupled to the gate node of the transistor 451, the drain node of the transistor 454, the output node 408, and the drain node of the transistor 444 of the current mirror circuit 440. Further, an inverted clock signal node can provide an inverted clock signal, as referenced in FIG. 4 by the term "$\overline{V_{CLK}}$," and can be coupled to the gate node of the transistors 453 and 454. Thus, the transistors 453 and 454 can be used to operate the transistors 451 and 452 in synchronization with an inverted clock signal.

In the current embodiment, the memory circuit 460 can be configured to include an inverter logic gates 461 and 462 and a NAND logic gates 465 and 466 to form an SR NAND latch circuit. In other embodiments, the memory circuit 460 can be a flip-flop, latch, SR NOR latch, JK latch, gated SR latch, gated D latch, Earle latch, D flip-flop, T flip-flop, JK flip-flop, RS flip-flop, RAM, other memory circuit or element, or any combination thereof. The inputs to the inverter logic gates 461 and 462 can be the second and first latched signals from the output nodes 408 and 407, respectively. The outputs from the inverter logic gates 461 and 462 can be an inverted second latched signal and an inverted first latched signal, as referenced in FIG. 4 by the terms "NODEA" and "NODEB," respectively. The outputs from the inverter logic gates 461 and 462 can be input to the NAND logic gates 465 and 466, respectively. Further, the NAND logic gates 465 and 466 can be cross-coupled by connecting each output of the NAND logic gate to the input of the other NAND logic gate. The outputs of the NAND logic gates 465 and 466 are a first and second NAND output signals, referenced in FIG. 4 by the terms "COUTP" and "COUTM," respectively.

In FIG. 4, the control circuit 470 can be configured to include an XOR logic gate 471, an AND logic gate 472, and an inverter logic gate 473. The control circuit 470 can generate a control signal that is used to control a bias current provided by the bias circuit 420 to any of the circuits or elements associated with the comparator 400. For example, the control circuit 470 can generate a control signal to control a bias current provided by the bias circuit 420 to place the amplifier circuit, the voltage comparison circuit, the associated comparator circuit 430, or any combination thereof in an active mode, inactive mode, or both. The inputs to the XOR logic gate 471 can be the inverted second latched signal and the inverted first latched signal from the inverter logic gates 461 and 462 of the memory circuit 460, referenced in FIG. 4 by the terms "NODEA" and "NODEB," respectively. The output node of the XOR logic gate 471 can be coupled to a first input node of the AND logic gate 472. A clock signal node can provide a clock signal, as referenced in FIG. 4 by the term "$V_{CLK}$," and can be coupled to the input node of the AND logic gate 472. The output node of the AND logic gate 472 can provide an inverted control signal, referenced in FIG. 4 by the term "$\overline{SW}$." Further, the inverted control signal can be input to the inverter logic gate 473 to form a control signal, referenced in FIG. 4 by the term "SW." The control signal, inverted control signal, or both can be input to the switch circuit 480.

In another embodiment, the control circuit 470 can be configured to include an XOR logic gate 471 and an inverter logic gate 473. The inputs to the XOR logic gate 471 can be the inverted second latched signal and the inverted first latched signal from the inverter logic gates 461 and 462 of the memory circuit 460, referenced in FIG. 4 by the terms "NODEA" and "NODEB," respectively. The output node of the XOR logic gate 471 can provide an inverted control signal, referenced in FIG. 4 by the term "$\overline{SW}$." Further, the inverted control signal can be input to the inverter logic gate 473 to form a control signal, referenced in FIG. 4 by the term "SW." The control signal, inverted control signal, or both can be input to the switch circuit 480.

In the current embodiment, the switch circuit 480 can be configured to include a switch 481. The switch circuit 480 can be switched to place the amplifier circuit, the voltage comparison circuit, the associated comparator circuit 430, another circuit or element, or any combination thereof in an active mode, inactive mode, or both by controlling its bias current provided by the bias circuit 420. One end node of the switch 481 can be coupled to the output node of the constant current source circuit 410. The other end node of the switch 481 can be coupled to the drain and gate nodes of the transistor 421 of the bias circuit 420. The switch 481 can be controlled by the control signal provided at the output node of the inverter logic gate 473 of the control circuit 470, referenced in FIG. 4 by the term "SW."

For example, a control signal set to a high voltage level, as generated by the control circuit 470, can close the switch 481. Thus, the bias circuit 420 can substantially mirror the constant current generated by the constant current source circuit 410 in providing a sufficient bias current for the amplifier circuit, the voltage difference circuit, the associated comparator circuit 430, or any combination thereof, placing such circuit in an active mode. Alternatively, a control signal set to a low voltage level, as generated by the control circuit 470, can open the switch 481. With the switch 481 opened, the bias circuit 420 does not receive a constant current from the constant current source circuit 481; thus, bias circuit 420 does not provide a sufficient bias current for the amplifier circuit, the voltage difference circuit, the associated comparator circuit 430, or any combination thereof, placing such circuit in an inactive mode.

In operation, if the inverted clock signal is high ($\overline{V_{CLK}}$=1) at the gate nodes of the transistors 453 and 454, then the latch circuit 450 is operated in a regenerate state. Thus, the latch circuit 450 latches the difference signal at the output node 407 and the inverted difference signal at the output node 408 to the voltage level at either the voltage supply source node 401 or the voltage supply source node 402. The first and second latched signals at the output nodes 407 and 408 are input to and stored by the memory circuit 460.

For example, if the voltage level at the input node 403 is greater than the voltage level at the reference node 405 ($V_{IN}>V_R$), then the latch circuit 450 during its regenerate state will latch the voltage level on the output node 407 to the voltage supply source node 402 ($V_{O+} \approx V_{SS}$) and will latch the voltage level on the output node 408 to the voltage supply source node 401 ($V_{O-} \approx V_{DD}$). However, if the voltage level at the input node 403 is less than the voltage level of the signal at the reference node 405 ($V_{IN}<V_R$), then the latch circuit 450 during its regenerate state will latch the voltage level on the output node 407 to the voltage supply source node 401 ($V_{O+} \approx V_{DD}$) and will latch the voltage level on the output node 408 to the voltage supply source node 402 ($V_{O-} \approx V_{SS}$).

Further, the memory circuit 460 inverts the second and first latched signals using the inverter logic gates 461 and 462 to generate the inverted second latched signal and the inverted first latched signal (NODEA=0 and NODEB=1), respectively. Thus, the memory circuit 460 will store a high digital signal (COMP=1). The control circuit 470 applies a logical XOR operation to the inverted signals using the XOR logic gate 471. The control circuit 470 then applies a logical AND operation to the output of the XOR logic gate 471 and the clock signal, as referenced in FIG. 4 by the term "$V_{CLK}$," using the AND logic gate 472 to generate an inverted switch signal, as referenced in FIG. 4 by the term "$\overline{SW}$." The control circuit 470 then inverts the inverted switch signal using the inverter logic gate 473 to generate a switch signal, as referenced in FIG. 4 by the term "SW." It should be recognized that the inverted first and second latched signals at the input of the XOR logic gate 471 are inverses of each other (NODEA∝NODEB). Thus, the output of the XOR logic gate 471 is a high voltage signal. Therefore, the AND logic gate 472 generates a high voltage level for the inverted switch signal ($\overline{SW}$=1) while the output of the XOR logic gate 471 is a high voltage signal and the clock signal is a high voltage level ($V_{CLK}$=1). Further, the inverter logic gate 472 generates a low voltage level for the switch signal (SW=0).

Alternatively, if the inverted clock signal is low ($\overline{V_{CLK}}$=0), the latch circuit 450 is operated in a reset state. Thus, the latch circuit 450 rapidly settles to about the same voltage level at the output node 407 and the output node 408 for the first and second latched signals. It should be recognized that the inverted first and second latched signals at the input of the XOR logic gate 471 are the same voltage level (NODEA=NODEB). Thus, the output of the XOR logic gate 471 is a low voltage signal. Therefore, the AND logic gate 472 generates a low voltage level for the inverted switch signal ($\overline{SW}$=0) while the output of the XOR logic gate 471 is a low voltage signal or the clock signal is a low voltage level ($V_{CLK}$=0). Further, the inverter logic gate 472 generates a high voltage level for the switch signal (SW=1).

In addition, the switch signal controls the switch circuit 480. When the switch signal is high, the switch 481 is closed; thus, the output node of the constant current source circuit 410 is coupled to the bias circuit 420. While in this state, the bias circuit 420 can provide a bias current to the comparator circuit 430 by substantially mirroring the bias current from the constant current source circuit 410. Therefore, the comparator circuit 430 is in an active mode resulting in the use of more bias current. However, when the switch signal is low, the switch 481 is open; thus, the output node of the constant current source circuit 410 is not coupled to the bias circuit 420. Thus, the bias circuit 420 cannot receive the constant current from the constant current source 410 to provide a sufficient bias current to the comparator circuit 430. Therefore, the comparator circuit 430 is in an inactive mode resulting in the use of less bias current.

Figure 5:
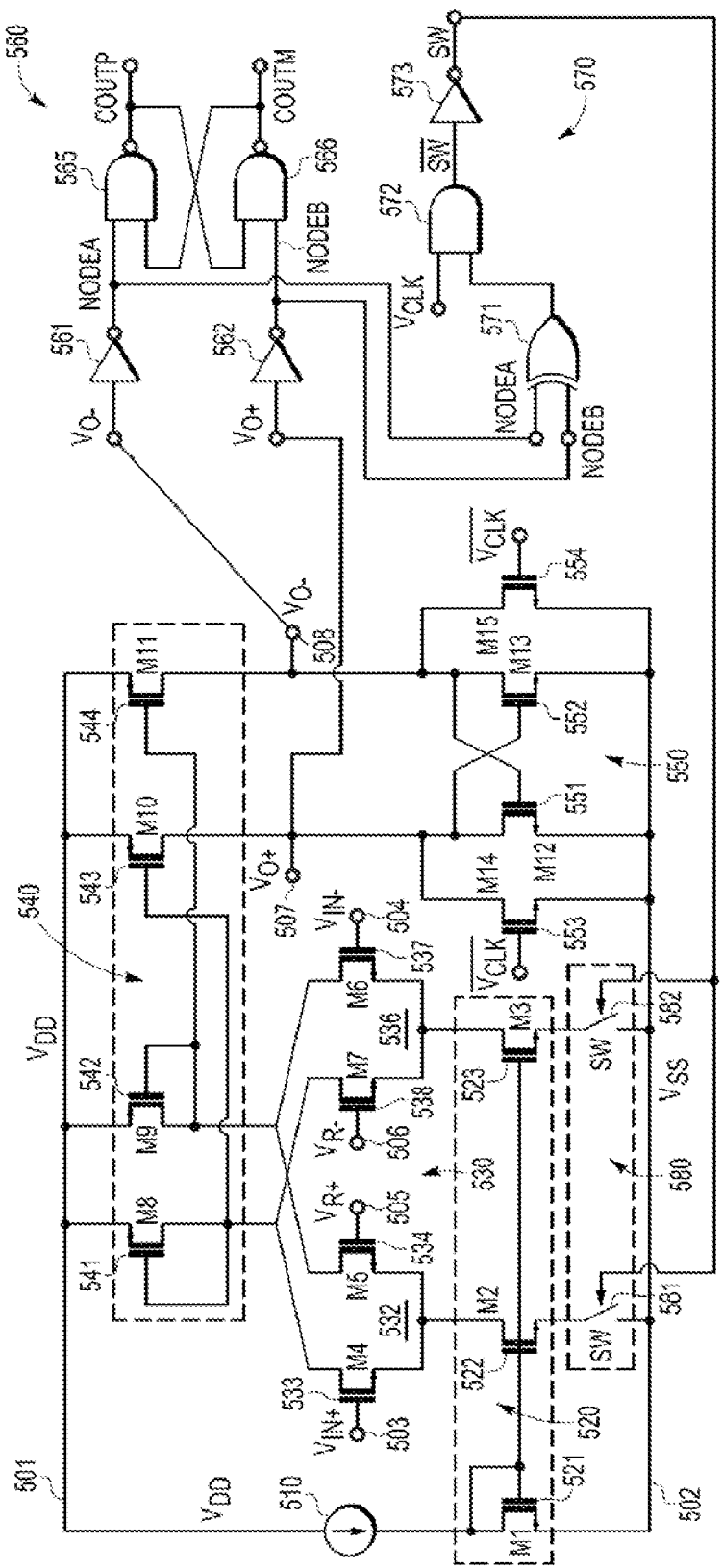
FIG. 5 illustrates a schematic representation of another embodiment of a comparator in accordance with various aspects set forth herein.

FIG. 5 illustrates a schematic representation of another embodiment of a comparator 500 in accordance with various aspects set forth herein. In FIG. 5, the comparator 500 can be configured to include a supply voltage source node 501, a supply voltage source node 502, a constant current source circuit 510, a bias circuit 520, a comparator circuit 530, a current mirror circuit 540, a latch circuit 550, a memory circuit 560, a control circuit 570, and a switch circuit 580. Further, the comparator 500 can include an input nodes 503 and 504 that can be configured to receive a positive differential input signal and a negative differential input signal, as referenced in FIG. 5 by the terms "$V_{IN+}$" and "$V_{IN-}$," respectively. Alternatively, the input nodes 503 and 504 can be configured to receive a single-ended input signal. Further, the comparator 500 can include a reference nodes 505 and 506 that can be configured to receive a positive differential reference signal and a negative differential reference signal, as referenced in FIG. 5 by the terms "$V_{R+}$" and "$V_{R-}$," respectively. Alternatively, the reference nodes 505 and 506 can be configured to receive a single-ended reference signal. Further, the reference nodes 505 and 506 can be configured to receive substantially the same reference signal. For example, the input nodes 503 and 504 and the reference nodes 505 and 506 can receive differential analog signals. In addition, the comparator 500 can include an output nodes 507 and 508 that can be configured to output a positive differential output signal and a negative differential output signal, as referenced in FIG. 5 by the terms "$V_{O+}$" and "$V_{O-}$," respectively. Alternatively, the output nodes 507 and 508 can be configured to output a single-ended output signal. For example, the output nodes 507 and 508 can output an analog signal or a digital signal. It should be recognized that while this embodiment illustrates the use of differential inputs and outputs, any combination of differential and single-ended inputs and outputs can be used for each of the circuits or elements in the combiner 500.

In the current embodiment, the supply voltage source node 501 can be configured to provide a first reference voltage level, referenced in FIG. 5 by the term "$V_{DD}$." Further, the supply voltage source node 502 can be configured to provide a second reference voltage level, referenced in FIG. 5 by the term "$V_{SS}$." For example, the supply voltage source node 501 can provide a positive 1.8 volt reference voltage level and the supply voltage source node 502 can provide a negative 1.8 volt reference voltage level. In another example, the supply voltage source node 501 can provide a positive 1.8 volt reference voltage level and the supply voltage source node 502 can provide a zero volt reference voltage level corresponding to a ground reference voltage level. In addition, the constant current source circuit 510 can be configured to provide a substantially constant bias current to the bias circuit 520. The constant current source circuit 510 can be implemented using, for instance, a voltage source in series with a resistor, a transistor-based active current source, a Zener-diode based active current source, a current mirror, another current source circuit, or any combination thereof. One end node of the constant current source circuit 510 can be coupled to the supply voltage source node 501 and the other end node can be coupled to the bias circuit 520.

In FIG. 5, the b as circuit 520 can be configured to include a transistors 521, 522 and 523. In this example, the transistors 521, 522 and 523 can each be an NMOS transistor. However, other types of transistors can be used such as a PMOS transistor, an NPN or PNP BJT, an N-type or P-type FET, another transistor type, or any combination thereof. The bias circuit 520 can be configured to provide a bias current to the comparator circuit 530 by, for instance, substantially mirroring the current flowing from the constant current source circuit 510 through the transistor 521 in the transistors 522 and 523. In this example, while the bias circuit 520 can be configured to use a current mirror circuit, other techniques or configurations can be used to perform the same or similar function. The transistor 521 can have its drain node coupled to its gate node and to the output node of the constant current source circuit 510—the drain node of the transistor 521 can also be referred to as the input node to the bias circuit 520. Further, the transistor 521 can have its gate node coupled via the switch circuit 580 to the gate nodes of the transistors 522 and 523. The transistors 522 and 523 can have their drain nodes coupled to the comparator circuit 530. The transistors 521, 522 and 523 can have their source nodes coupled to the supply voltage source node 502.

In the current embodiment, the comparator circuit 530 can be configured to include a differential amplifiers 532 and 536. The differential amplifier 532 can be configured to include a transistors 533 and 534. Further, the differential amplifier 536 can be configured to include a transistors 537 and 538. In this example, the transistors 533, 534, 537 and 538 can each be an NMOS transistor. However, other types of transistors can be used such as a PMOS transistor, NPN or PNP BJT, N-type or P-type FET, another transistor type, or any combination thereof. The transistor 533 can have its gate node coupled to the input node 503. The transistor 533 can have its drain node coupled to the drain node of the transistor 538 and to the current mirror circuit 540. The transistor 534 can have its gate node coupled to the reference node 505. The transistor 534 can have its drain node coupled to the drain node of the transistor 537 and to the current mirror circuit 540. The transistors 533 and 534 can have their source nodes coupled to the drain node of the transistor 522 of the bias circuit 520. The differential amplifier 532 can be configured to receive a bias current via the transistor 522 of the bias circuit 520. The differential amplifier 532 can compare the input signals provided at the input node 503 and the reference node 505 to provide a first difference signal ($V_{IN+}-V_{R+}$) at the drain node of the transistor 533 and an inverted first difference signal ($-(V_{IN+}-V_{R+})$) at the drain node of the transistor 534. The first difference signal and the inverted first difference signal can each be, for instance, an analog voltage signal.

Similarly, the transistor 537 can have its gate node coupled to the input node 504. The transistor 537 can have its drain node coupled to the drain node of the transistor 534 and to the current mirror circuit 540. The transistor 538 can have its gate node coupled to the reference node 506. The transistor 538 can have its drain node coupled to the drain node of the transistor 530 and to the current mirror circuit 540. The transistors 537 and 538 can have their source nodes coupled to the drain node of the transistor 523 of the bias circuit 520. The differential amplifier 536 can be configured to receive a bias current via the transistor 523 of the bias circuit 520. The differential amplifier 536 can compare the input signals provided at the input node 504 and the reference node 506 to provide a second difference signal ($V_{IN-}-V_{R-}$) at the drain node of the transistor 537 and an inverted second difference signal ($-(V_{IN-}-V_{R-})$) at the drain node of the transistor 538. The second difference signal and the inverted second difference signal can each be, for instance, an analog voltage signal. The first difference signal at the drain node of the transistor 533 can be combined with the inverted second difference signal at the drain node of the transistor 533 to form a difference signal (($V_{IN+}-V_{R+}$)-($V_{IN-}-V_{R-}$)). Further, the second difference signal at the drain node of the transistor 537 can be combined with the inverted first difference signal at the drain node of the transistor 534 to form an inverted difference signal ($-(V_{IN+}-V_{R+})+(V_{IN-}-V_{R-})$). The difference signal and inverted difference signal can each be, for instance, an analog voltage signal.

In this embodiment, the current mirror circuit 540 can be configured to include a transistors 541, 542, 543 and 544. In this example, the transistors 541, 542, 543 and 544 can each be a PMOS transistor. However, other types of transistors can be used such as an NMOS transistor, NPN or PNP BJT, N-type or P-type FET, other transistor type, or any combination thereof. The current mirror circuit 540 can be configured to operate by substantially mirroring the current flowing through the transistor 541 in the transistor 543 and by substantially mirroring the current flowing through the transistor 542 in the transistor 544. In this example, the difference signal and inverted difference signal output from the comparator circuit 530 can each be substantially mirrored by the current mirror circuit 540 to the output nodes 507 and 508, respectively. It should be recognized that the current mirror circuit 540 can be configured as two separate current mirrors—a first current mirror can include the transistors 541 and 543, and a second current mirror can include the transistors 542 and 544. While the current mirror circuit 540 can be configured to use two current mirror circuits, other techniques or configurations can be used to perform the same or similar function.

In FIG. 5, the transistor 541 can have its drain node coupled to its gate node, the drain nodes of the transistors 533 and 538 of the comparator circuit 530, and the gate node of the transistor 543. The transistor 542 can have its drain node coupled to its gate node, the drain nodes of the transistors 534 and 537 of the comparator circuit 530, and the gate node of the transistor 544. The transistor 543 can have its drain node coupled to the output node 507, the latch circuit 550, and the memory circuit 560. The transistor 544 can have its drain node coupled to the output node 508, the latch circuit 550, and the memory circuit 560. The transistors 541, 542, 543 and 544 can have their source nodes coupled to the supply voltage source node 501.

In this embodiment, the latch circuit 550 can be configured to include a transistors 551, 552, 553 and 554 used to latch the difference signal and inverted difference signal at the output nodes 507, 508 to generate a first and second latched signals, respectively. During the regenerate state of the latch circuit 550, the difference signal and inverted difference signal at the output nodes 507 and 508 can latch to different voltage levels on either of the voltage supply source nodes 501 and 502.

Alternatively, during the reset state of the latch circuit 550, the voltage levels on the output nodes 507 and 508 can latch to the same voltage level on either of the voltage supply source nodes 501 and 502. In this example, the transistors 551, 552, 553 and 554 can each be an NMOS transistor. However, other types of transistors can be used such as a PMOS transistor, NPN or PNP BJT, N-type or P-type FET, other transistor type, or any combination thereof. The transistors 551 and 552 can be configured as inverters by connecting the input of one transistor to the output of the other transistor. The transistor 551 can have its drain node coupled to the gate node of the transistor 552, the drain node of the transistor 553, the output node 507, and the drain node of the transistor 543 of the current mirror circuit 540. The transistor 552 can have its drain node coupled to the gate node of the transistor 551, the drain node of the transistor 554, the output node 508, and the drain node of the transistor 544 of the current mirror circuit 540. Further, an inverted clock signal node can provide an inverted clock signal, as referenced in FIG. 5 by the term "$\overline{V_{CLK}}$," and can be coupled to the gate node of the transistors 553 and 554. Thus, the transistors 553 and 554 can be used to operate the transistors 551 and 552, respectively, in synchronization with an inverted clock signal.

In FIG. 5, the memory circuit 560 can be configured to include an inverter logic gates 561 and 562 and a NAND logic gates 565 and 566 to form an SR NAND latch circuit. In other embodiments, the memory circuit 560 can be a flip-flop, latch, SR NOR latch, JK latch, gated SR latch, gated D latch, Earle latch, D flip-flop, T flip-flop, JK flip-flop, RS flip-flop, RAM, other memory circuit or element, or any combination thereof. The inputs to the inverter logic gates 561 and 562 can be the second and first latched signals from the output nodes 508 and 507, respectively. The outputs from the inverter logic gates 561 and 562 is an inverted second latched signal and an inverted first latched signal, referenced in FIG. 5 by the terms "NODEA" and "NODEB," respectively. The outputs from the inverter logic gates 561 and 562 can be input to the NAND logic gates 565 and 566, respectively. Further, the NAND logic gates 565 and 566 can be cross-coupled by connecting each output of the NAND logic gate to the input of the other NAND logic gate. The outputs of the NAND logic gates 565 and 566 are a first and second NAND output signals, referenced in FIG. 5 by the terms "COUTP" and "COUTM," respectively.

In FIG. 5, the control circuit 570 can be configured to include an XOR logic gate 571, an AND logic gate 572, and an inverter logic gate 573. The control circuit 570 can generate a control signal that is used to control a bias current provided by the bias circuit 520 to any of the circuits or elements associated with the comparator 500. For example, the control circuit 570 can generate a control signal to control a bias current provided by the bias circuit 520 to place the amplifier circuit, the voltage difference circuit, the associated comparator circuit 530, or any combination thereof in an active mode, inactive mode, or both. The inputs to the XOR logic gate 571 can be the inverted second latched signal and the inverted first latched signal from the inverter logic gates 561 and 562 of the memory circuit 560, referenced in FIG. 5 by the terms "NODEA" and "NODEB," respectively. The output node of the XOR logic gate 571 can be coupled to a first input node of the AND logic gate 572. A clock signal node can provide a clock signal, as referenced in FIG. 5 by the term "$V_{CLK}$," and can be coupled to the input node of the AND logic gate 572. The output node of the AND logic gate 572 can provide an inverted control signal, referenced in FIG. 5 by the term "$\overline{SW}$." Further, the inverted control signal can be input to the inverter logic gate 573 to form a control signal, referenced in FIG. 5 by the term "SW." The control signal, inverted control signal, or both can be input to the switch circuit 580.

In another embodiment, the control circuit 570 can be configured to include an XOR logic gate 571 and an inverter logic gate 573. The inputs to the XOR logic gate 571 can be the inverted second latched signal and the inverted first latched signal from the inverter logic gates 561 and 562 of the memory circuit 560, referenced in FIG. 5 by the terms "NODEA" and "NODEB," respectively. The output node of the XOR logic gate 571 can provide an inverted control signal, referenced in FIG. 5 by the term "$\overline{SW}$." Further, the inverted control signal can be input to the inverter logic gate 573 to form a control signal, referenced in FIG. 5 by the term "SW." The control signal, inverted control signal, or both can be input to the switch circuit 580.

In this embodiment, the switch circuit 580 can be configured to include a switches 581 and 582. The switch circuit 580 can be switched to place the amplifier circuit, the voltage comparison circuit, the associated comparator circuit 530, another circuit or element, or any combination thereof in an active mode, inactive mode, or both by controlling its bias current provided by the bias circuit 520, respectively. One end node of the switch 581 can be coupled to the source node of the transistor 522. The other end node of the switch 581 can be coupled to the power supply node 502. Similarly, one end node of the switch 582 can be coupled to the source node of the transistor 523. The other end node of the switch 582 can be coupled to the power supply node 502. The switches 581 and 582 can be controlled by the control signal provided at the output node of the inverter logic gate 573 of the control circuit 570, referenced in FIG. 5 by the term "SW." For example, a control signal with a high voltage level, as generated by the control circuit 570, can close the switches 581 and 582. Thus, the bias circuit 520 can substantially mirror the current generated by the constant current source circuit 510 in providing a bias current to the amplifier circuit, the voltage difference circuit, the associated comparator circuit 530, or any combination thereof, placing such circuits in an active mode. Alternatively, a control signal with a low voltage level, as generated by the control circuit 570, can open the switches 581 and 582. Thus, the bias circuit 520 does not provide a sufficient bias current for the amplifier circuit, the voltage difference circuit, the associated comparator circuit 530, or any combination thereof, placing such circuits in an inactive mode.

In another example, the constant current provided by the constant current source circuit 510 can be mirrored by the bias circuit 520 in providing a sufficient bias current to the comparator circuit 530 by switching the switches 581 and 582 in response to the control signal to couple the gate nodes of the transistors 522 and 523 to the voltage supply source node 502. Alternatively, the mirroring of the constant current by the bias circuit 520 can be disabled by switching the switches 581 and 582 in response to the control signal to decouple the gate nodes of the transistors 522 and 523 from the voltage supply source node 502.

In operation, if the inverted clock signal is high ($\overline{V_{CLK}}$=1) at the gate nodes of the transistors 553 and 554, then the latch circuit 550 is operated in a regenerate state. Thus, the latch circuit 550 latches the difference signal at the output node 507 and the inverted difference signal at the output node 508 to the voltage level at either the voltage supply source node 501 or the voltage supply source node 502 resulting in a first and second latched signals, respectively. The first and second latched signals at the output nodes 507 and 508 are input to and stored by the memory circuit 560, respectively.

For example, if the voltage level at the input node 503 is greater than the voltage level at the reference node 505 ($V_{IN+}$>$V_{R+}$) and the voltage level at the input node 504 is less than the voltage level at the reference node 506 ($V_{IN-}$<$V_{R-}$) then the latch circuit 550 during regenerate state will latch the voltage level on the output node 507 to the voltage supply source node 502 ($V_{O+}$≈$V_{SS}$) and will latch the voltage level on the output node 508 to the voltage supply source node 501 ($V_{O-}$≈$V_{DD}$). However, if the voltage level at the input node 503 is less than the voltage level of the signal at the reference node 505 and the voltage level at the input node 504 is greater than the voltage level at the reference node 506, then the latch circuit 550 during regenerate state will latch the voltage level on the output node 507 to the voltage supply source node 501 ($V_{O+}$≈$V_{DD}$) and will latch the voltage level on the output node 508 to the voltage supply source node 502 ($V_{O-}$≈$V_{SS}$).

Further, the memory circuit 560 inverts the second and first latched signals using the inverter logic gates 561 and 562 to generate the inverted second latched signal and the inverted first latched signal (NODEA=0 and NODEB=1), respectively. Thus, the memory circuit 560 will store a high digital signal (COUTP=1). The control circuit 570 applies a logical XOR operation to the inverted first latched signal and the inverted second latched signal using the XOR logic gate 571. The control circuit 570 then applies a logical AND operation to the output of the XOR logic gate 571 and the clock signal, as referenced in FIG. 5 by the term "$V_{CLK}$," using the AND logic gate 572 to generate an inverted switch signal, as referenced in FIG. 5 by the term "$\overline{SW}$." The control circuit 570 then inverts the inverted switch signal using the inverter logic gate 573 to generate a switch signal, as referenced in FIG. 5 by the term "SW." It should be recognized that the inverted signals at the input of the XOR logic gate 571 are inverses of each other (NODEA∝NODEB). Thus, the output of the XOR logic gate 571 is a high voltage signal. Therefore, the AND logic gate 572 generates a high voltage level for the inverted switch signal ($\overline{SW}$=1) while the output of the XOR logic gate 571 is a high voltage signal and the clock signal is a high voltage level ($V_{CLK}$=1). Further, the inverter logic gate 572 generates a low voltage level for the switch signal (SW=0).

Alternatively, if the inverted clock signal is low ($\overline{V_{CLK}}$=0), the latch circuit 550 is operated in a reset state. Thus, the latch circuit 550 rapidly settles to about the same voltage level at the output nodes 507 and 508. It should be recognized that the inverted signals at the input of the XOR logic gate 571 are about the same voltage level (NODEA≈NODEB). Thus, the output of the XOR logic gate 571 is a low voltage signal. Therefore, the AND logic gate 572 generates a low voltage level for the inverted switch signal ($\overline{SW}$=0) while the output of the XOR logic gate 571 is a low voltage signal or the clock signal is a low voltage level ($V_{CLK}$=0). Further, the inverter logic gate 572 generates a high voltage level for the switch signal (SW=1).

In addition, the switch signal, as referenced in FIG. 5 by the term "SW," controls the switch circuit 580. When the switch signal is high (SW=1), the switches 581 and 582 are closed; thus, the gates of the transistors 522 and 523 are coupled to the voltage supply source node 502. While in this state, the bias circuit 520 can provide a bias current to the comparator circuit 530 by substantially mirroring the bias current from the constant current source circuit 510. However, when the switch signal is low (SW=0), the switches 581 and 582 are open; thus, the gates of the transistors 522 and 523 are not coupled to the voltage supply source node 502. While in this state, the transistors 522 and 523 are in an inactive mode. Thus, the bias circuit 520 cannot provide a sufficient bias current to the comparator circuit 530 to place it in an active mode. Therefore, the comparator circuit 530 is in an inactive mode resulting in the use of less bias current.

Figure 6:
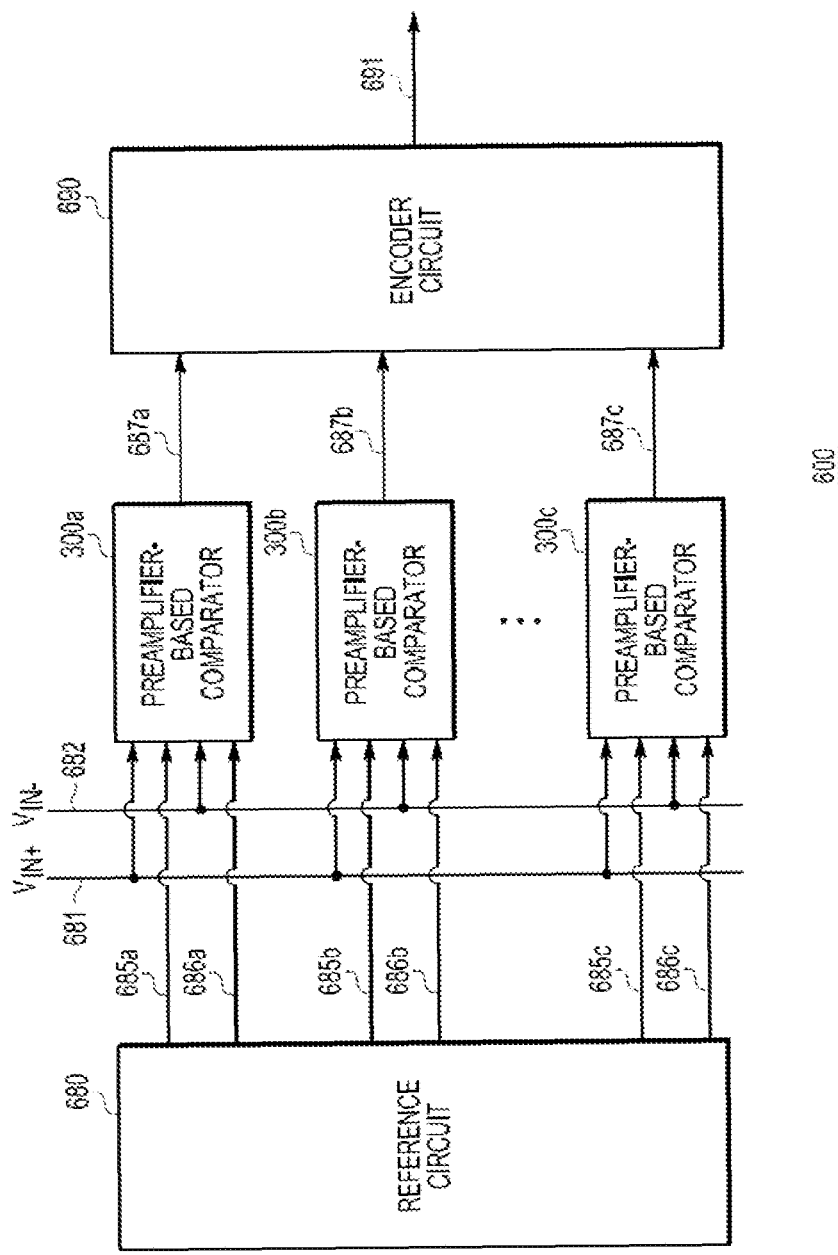
FIG. 6 illustrates a schematic representation of an analog-to-digital converter using the comparator of FIG. 3 in accordance with various aspects set forth herein.

FIG. 6 illustrates a schematic representation of an analog-to-digital converter 600 using the comparator 300 in accordance with various aspects set forth herein. The analog-to-digital converter 600 can be used in a direct conversion ADC, flash ADC, successive-approximation ADC, ramp-compare ADC, Wilkinson ADC, integrating ADC, delta-encoded ADC, pipeline ADC, sigma-delta ADC, or other types of ADCs. The analog-to-digital converter 600 can be configured to include a comparators 300a, 300b, 300c, a reference circuit 680, and an encoder circuit 690. The reference circuit 680 generates a first reference signals 685a, 685b, 685c and a second reference signals 686a, 686b, 686c, In one embodiment, the first set of reference signals 685a, 685b, 685c is the same as the second set of reference signals 686a, 686b, 686c. The reference circuit can be, for instance, a resistance ladder, or the like. The number of reference voltages needed depends on the number of bits of resolution, N, of the converter 600 and corresponds to two to the power of N reference voltages. For example, if three bits of resolution are used, then eight reference voltages are needed. It should be recognized that while this embodiment illustrates the use of differential inputs to the comparators 300a, 300b, and 300c, single-ended inputs can also be used. In addition, the converter 600 can be configured to include, for instance, $2^N$ comparators 300a, 300b and 300c. For example, if three bits of resolution are used, then eight comparators 300a, 300b and 300c are needed. In another embodiment, the converter 600 can be configured to include, for instance, $2^N 1$ comparators 300a, 300b and 300c. For example, if three bits of resolution are used, then seven comparators 300a, 300b and 300c are needed.

In this embodiment, the converter 600 can include an input nodes 681 and 682 that can be configured to receive a positive differential input signal and a negative differential input signal, as referenced in FIG. 6 by the terms "$V_{IN+}$" and "$V_{IN-}$," respectively. In another embodiment, the input nodes 681 and 682 can receive a single-ended input signal. Further, the input node 681 can be coupled to the input node 303 of each comparator 300a, 300b and 300c, Similarly, the input node 682 can be coupled to the input node 304 of each comparator 300a, 300b and 300c. Also, the reference circuit 680 can be configured to output a first reference signals 685a, 685b and 685c to the reference node 305 of the comparators 300a, 300b and 300c, respectively. Similarly, the reference circuit 680 can be configured to output a second reference signals 686a, 686b and 686c to the reference node 305 of the comparators 300a, 300b and 300c, respectively. In another embodiment, the first reference signals 685a, 685b and 685c can be about the same as the second reference signals 686a, 686b and 686c. Finally, each comparator 300a, 300b and 300c can be configured to output a digital signals 687a, 687b and 687c from its memory circuit 360 to the encoder circuit 690, wherein the encoder circuit 690 uses such digital signals to generate an N-bit data sample.

In operation, the input nodes 303 and 304 of each comparator 300a, 300b and 300c receive from the input nodes 681 and 682 a positive differential input signal and a negative differential input signal, as referenced in FIG. 6 by the terms "$V_{IN+}$" and "$V_{IN-}$," respectively. Further, the reference circuit 680 outputs positive reference voltage steps represented by the first reference signals 685a, 685b and 685c to the reference node 305 of the comparators 300a, 300b and 300c, respectively. Similarly, the reference circuit 680 outputs negative reference voltage steps represented by a second reference signals 686a, 686b and 686c to the reference node 306 of the comparators 300a, 300b and 300c, respectively. Each of the comparators 300a, 300b and 300c compares the input signal 681 to the first reference signal 685a, 685b and 685c to generate a first difference signal ($V_{IN+} - V_{R+}$) and an inverted first difference signal ($-(V_{IN+} - V_{R+})$), respectively. Further, each of the comparators 300a, 300b and 300c compares the input signal 682 to the second reference signal 685a, 685b and 685c to generate a second difference signal ($V_{IN-} - V_{R-}$) and an inverted second difference signal ($-(V_{IN-} - V_{R-})$), respectively. The first difference signal and the inverted second difference signal are combined to form a difference signal (($V_{IN+} - V_{R+}) - (V_{IN-} - V_{R-})$). Similarly, the inverted first difference signal and the second difference signal are combined to form an inverted difference signal ($-(V_{IN+} - V_{R+}) + (V_{IN-} - V_{R-})$). The difference signal and inverted difference signal are latched and then input to the memory circuit 360 of each of the comparators 300a, 300b and 300c. The memory circuit 360 of each of the comparators 300a, 300b and 300c outputs a digital signal 687a, 687b and 687c, respectively. The encoder circuit 690 uses the digital signals 687a, 687b and 687c to generate an N-bit data sample.

Figure 7:
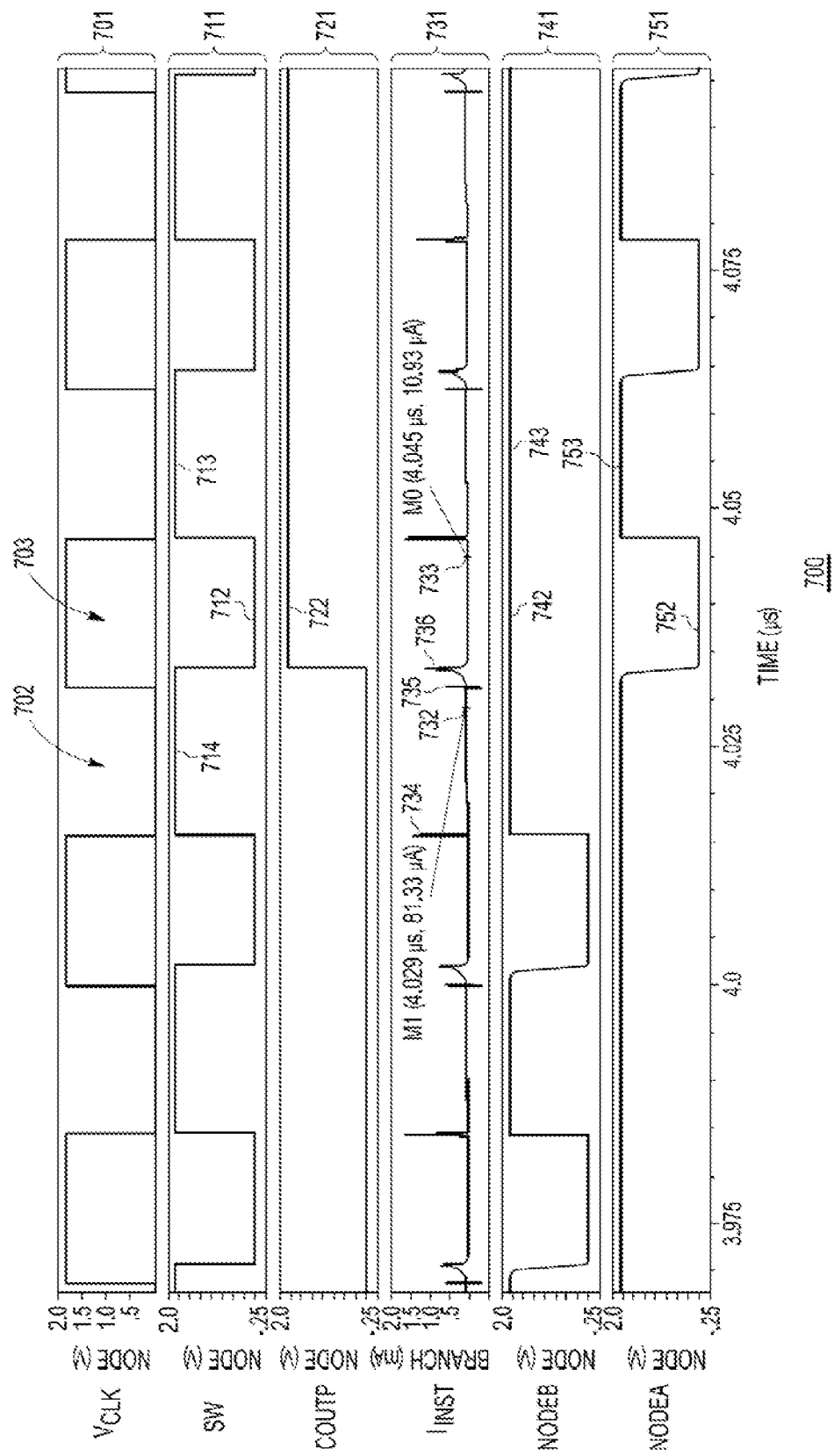
FIG. 7 shows waveforms useful for understanding the relationship between a clock signal, output signals, and an instantaneous current in the comparator shown in FIG. 3 in accordance with various aspects set forth herein.

FIG. 7 shows waveforms useful for understanding the relationship between a clock signal 701, as referenced in FIG. 7 by the term "$V_{CLK}$;" a control signal 711, as referenced in FIG. 7 by the term "SW;" a digital output signal 721, as referenced in FIG. 7 by the term "COUTP;" an instantaneous current 731, as referenced in FIG. 7 by the term "$I_{INST}$;" an inverted second latched signal 741, as referenced in FIG. 7 by the term "NODEB;" and an inverted first latched signal 751, as referenced in FIG. 7 by the term "NODEA," in the comparator 300 shown in FIG. 3 in accordance with various aspects set forth herein. The graphical illustration in its entirety is referred to by 700. The instantaneous current 731 is the instantaneous current drawn from the voltage supply source node 301, as referenced in FIG. 3 by the term "$V_{DD}$." Further, the performance of comparator 300 was measured using the constant current source circuit 310 configured to provide ten microamps (uA).

In operation, when the clock signal 701 is low ($V_{CLK}=0$), the latch circuit 350 is operated in a regenerate state, as shown at 702. Since the voltage level at the input node 303 is greater than the voltage level at the reference node 305 ($V_{IN+} > V_{R+}$) and the voltage level at the input node 304 is less than the voltage level at the reference node 306 ($V_{IN-} < V_{R-}$), then the latch circuit 350 during its regenerate state will latch the voltage level on the output node 307 to the voltage supply source node 302 ($V_{O+} \approx V_{SS}$) and will latch the voltage level on the output node 308 to the voltage supply source node 301 ($V_{O-} \approx V_{DD}$) resulting in a first and second latched signals, respectively.

Further, the memory circuit 360 inverts the second and first latched signals using the inverter logic gates 361 and 362 to generate the inverted second latched signal (NODEA=0) and the inverted first latched signal (NODEB=1), as shown at 752 and 742, respectively. Thus, the memory circuit 360 will store a high digital signal (COUTP=1), as shown at 722. The control circuit 370 applies a logical XOR operation to the inverted first latched signal (NODEB=1) and the inverted second latched signal (NODEA=0) using the XOR logic gate 371. The control circuit 370 then applies a logical AND operation to the output of the XOR logic gate 371 and the clock signal 701 using the AND logic gate 372 to generate an inverted switch signal ($\overline{SW}$). Thus, the output of the XOR logic gate 371 is a high voltage signal while the inverted first latched signal and the inverted second latched signal are inverses of each other and the clock signal is high ($V_{CLK}=1$). Thus, the AND logic gate 372 generates a high voltage signal for the inverted switch signal ($\overline{SW}=1$). Further, the inverter logic gate 372 generates a low voltage level for the switch signal 711 (SW=0), as shown at 712. Thus, the switch 381 is open and the switch 382 is closed, resulting in coupling the gates of the transistors 322 and 323 to the voltage supply source node 302. While in this state, the bias circuit 320 does not provide a sufficient bias current to the comparator circuit 330. Therefore, the comparator circuit 330 is placed into an inactive mode, resulting in lower power consumption.

Alternatively, when the clock signal 701 is high ($V_{CLK}$=1), then the latch circuit 350 is operated in a reset state, as shown at 703. Thus, the latch circuit 350 rapidly settles to about the same voltage level for the difference signal at the output node 307 and the inverted difference signal at the output node 308 ($V_{O+} \approx V_{O-} \approx V_{DD}$) resulting in latching the first and second latched signals at the output nodes 307 and 308, respectively. Further, the memory circuit 360 inverts the second and first latched signals using the inverter logic gates 361 and 362 to generate the inverted second latched signal and the inverted first latched signal (NODEA=1 and NODEB=1), as shown at 753 and 743. respectively. Thus, the output of the XOR logic gate 371 is a low voltage signal. Therefore, the inverted switch signal at the output of the AND logic gate 372 is a low voltage signal ($\overline{SW}$=0). Further, the inverter logic gate 372 generates a high voltage signal for the switch signal (SW=1), as shown at 713. Thus, the switch 381 is closed and the switch 382 is open, resulting in coupling the gate of the transistor 321 to the gate of the transistors 322 and 323. While in this state, the bias circuit 320 can provide a bias current to the comparator circuit 330 by substantially mirroring the bias current from the constant current source circuit 310. Therefore, the comparator circuit 330 is placed into an active mode, resulting in higher power consumption.

During the period that the control signal 711 is set to a high voltage level (SW=1), as shown at 714, corresponding to the bias circuit 320 providing a sufficient bias current to place the comparator circuit 330 in an active mode, the instantaneous current 731 of the comparator 300 is measured at 81.33 microamps (uA), as shown at 732. During the period that the control signal 711 is set to a low voltage level (SW=0), as shown at 712, corresponding to the bias circuit 320 not providing a sufficient bias current to place the comparator circuit 330 into an active mode, the instantaneous current 731 of the comparator 300 is measured at 10.93 uA, as shown at 733. It should be recognized that the 10.93 uA bias current measurement includes the 10 uA generated by the constant current source circuit 310. Further, it should be recognized that the current spikes, as shown at 734, 735 and 736, can be associated with the instantaneous current drawn during the regeneration time, the reset time, and the latch time, respectively. Therefore, factoring the duty cycle, the average bias current consumed by the comparator 300 is less than the average bias current consumed by the comparator 100 operating in a continuous mode.

Figure 8:
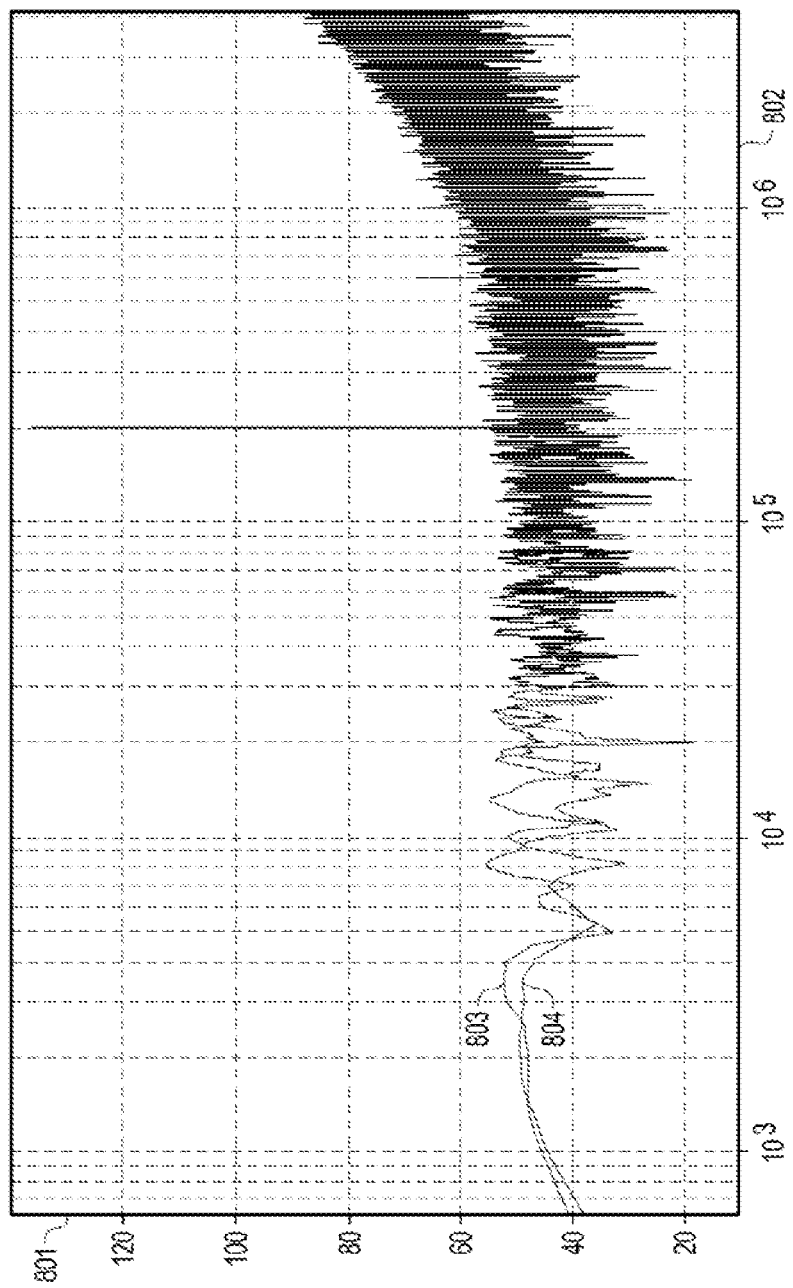
FIG. 8 illustrates simulation results of the comparator described in FIG. 3 in accordance with various aspects set forth herein.

FIG. 8 illustrates simulation results of the output of a second-order three-bit continuous-time sigma-delta modulator using the comparator 300 described in FIG. 3 in accordance with various aspects set forth herein. The graphical illustration in its entirety is referred to by 800. The magnitude in decibels (dB) is shown on the ordinate 801 and is plotted in the range from twenty dB to one hundred and twenty dB. The frequency in Hertz (Hz) is shown on the abscissa 802 and is plotted on a logarithmic scale. A graph 803 shows the fast Fourier transform (FFT) of the output of a second-order, three-bit, continuous-time, sigma-delta modulator using the comparator 300. A graph 804 shows the FFT of the output of a second-order, three-bit, continuous-time, sigma-delta modulator using the comparator 100. The results show that the second-order, three-bit, continuous-time, sigma-delta modulator using the comparator 300 provides about the same performance as the second-order, three-bit, continuous-time, sigma-delta modulator using the comparator 100. Therefore, the comparator 300 operates with more power efficiency while maintaining the same or similar performance as the comparator 100 operating in a continuous mode.

Figure 9:
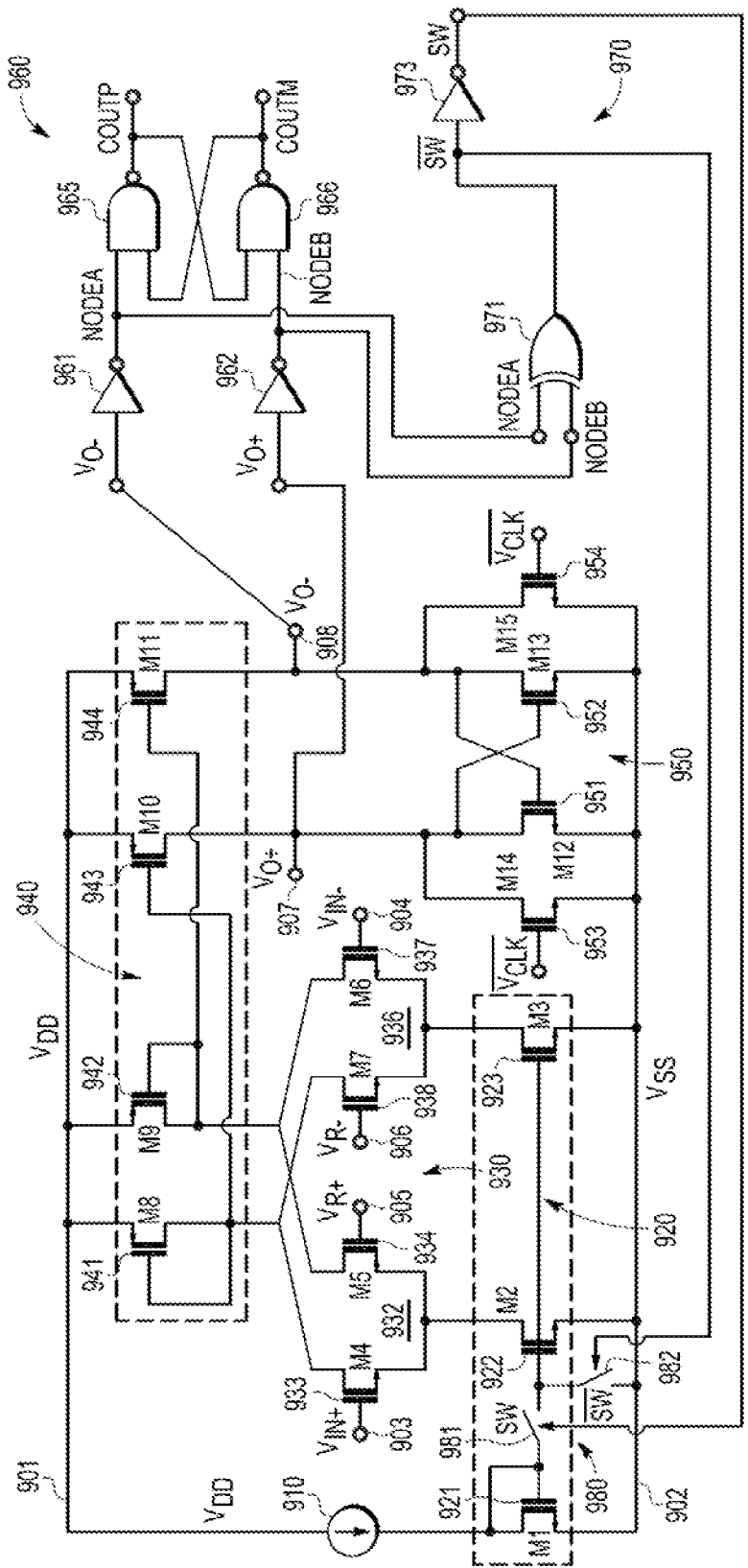
FIG. 9 illustrates a schematic representation of another embodiment of a comparator in accordance with various aspects set forth herein.

FIG. 9 is a schematic representation of another embodiment of a comparator 900 in accordance with various aspects set forth herein. In FIG. 9, the comparator 900 can be configured to include a supply voltage source nodes 901 and 902, a constant current source circuit 910, a bias circuit 920, a comparator circuit 930, a current mirror circuit 940, a latch circuit 950, a memory circuit 960, a control circuit 970, and a switch circuit 980. Further, the comparator 900 can include an input nodes 903 and 904 that can be configured to receive a positive differential input signal and a negative differential input signal as referenced in FIG. 9 by the terms "$V_{IN+}$" and "$V_{IN-}$," respectively.

Alternatively, the input nodes 903 and 904 can be configured to receive a single-ended input signal. Further, the comparator 900 can include a reference nodes 905 and 906 that can be configured to receive a positive differential reference signal and a negative differential reference signal, as referenced in FIG. 9 by the terms "$V_{R+}$" and "$V_{R-}$," respectively. Alternatively, the reference nodes 905 and 906 can be configured to receive a single-ended reference signal. Further, the reference nodes 905 and 906 can be configured to receive substantially the same reference signal. In one example, the input nodes 903 and 904 and the reference nodes 905 and 906 can receive differential, analog signals. In addition, the comparator 900 can include an output nodes 907 and 908 that can be configured to output a positive differential output signal and a negative differential output signal, as referenced in FIG. 9 by the terms "$V_{O+}$" and "$V_{O-}$," respectively. Alternatively, the output nodes 907 and 908 can be configured to output a single-ended output signal. The output nodes 907 and 908 can output an analog signal or a digital signal. It should be recognized that while this embodiment illustrates the use of differential inputs and outputs, any combination of differential and single-ended inputs and outputs can be used for the various circuits or elements in the comparator 900.

In the current embodiment, the supply voltage source node 901 can be configured to provide a first reference voltage level, referenced in FIG. 9 by the term "$V_{DD}$." Further, the supply voltage source node 902 can be configured to provide a second reference voltage level, referenced in FIG. 9 by the term "$V_{SS}$." In addition, the constant current source circuit 910 can be configured to provide a substantially constant bias current to the bias circuit 920. The constant current source circuit 910 can be implemented using, for instance, a voltage source in series with a resistor, a transistor-based active current source, a Zener-diode based active current source, a current mirror, another current source circuit, or any combination thereof. One end node of the constant current source circuit 910 can be coupled to the supply voltage source node 901 and the other end node can be coupled to the bias circuit 920.

In FIG. 9, the bias circuit 920 can be configured to include a transistors 921, 922 and 923. In this example, the transistors 921, 922 and 923 can each be an NMOS transistor. However, other types of transistors can be used such as a PMOS transistor, an NPN or PNP BJT, an N-type or P-type FET, another transistor type, or any combination thereof. The bias circuit 920 can be configured to provide a bias current to the comparator circuit 930 by, for instance, substantially mirroring the current flowing from the constant current source circuit 910 through the transistor 921 in the transistors 922 and 923.

In this example, while the bias circuit 920 can be configured to use a current mirror circuit, other techniques or configurations can be used to perform the same or similar function. The transistor 921 can have its drain node coupled to its gate node and to the output node of the constant current source circuit 910—the drain node of the transistor 921 can also be referred to as the input node to the bias circuit 920. Further, the transistor 921 can have its gate node coupled via the switch circuit 980 to the gate nodes of the transistors 922 and 923. The transistors 922 and 923 can have their drain nodes coupled to the comparator circuit 930. The transistors 921, 922 and 923 can have their source nodes coupled to the supply voltage source node 902.

In the current embodiment, the comparator circuit 930 can be configured to include a differential amplifiers 932 and 936. The differential amplifier 932 can be configured to include a transistors 933 and 934. Further, the differential amplifier 936 can be configured to include a transistors 937 and 938. In this example, the transistors 933, 934, 937 and 938 can each be an NMOS transistor. However, other types of transistors can be used such as a PMOS transistor, NPN or PNP BJT, N-type or P-type FET, another transistor type, or any combination thereof. The transistor 933 can have its gate node coupled to the input node 903, as referenced in FIG. 9 by the term "$V_{IN+}$." The transistor 933 can have its drain node coupled to the drain node of the transistor 938 and to the current mirror circuit 940. The transistor 934 can have its gate node coupled to the reference node 905, as referenced in FIG. 9 by the term "$V_{R+}$." The transistor 934 can have its drain node coupled to the drain node of the transistor 937 and to the current mirror circuit 940. The transistors 933 and 934 can have their source nodes coupled to the drain node of the transistor 922 of the bias circuit 920. The differential amplifier 932 can be configured to receive a bias current via the transistor 922 of the bias circuit 920. The differential amplifier 932 can compare the positive differential input signal at the input node 903 and the positive differential reference signal at the reference node 905 to provide a first difference signal $(V_{IN+}-V_{R+})$ at the drain node of the transistor 933 and an inverted first difference signal $(-(V_{IN+}-V_{R+}))$ at the drain node of the transistor 934. The first difference signal and the inverted first difference signal can each be, for instance, an analog voltage signal.

Similarly, the transistor 937 can have its gate node coupled to the input node 904, as referenced in FIG. 9 by the term "$V_{IN-}$." The transistor 937 can have its drain node coupled to the drain node of the transistor 934 and to the current mirror circuit 940. The transistor 938 can have its gate node coupled to the reference node 906, as referenced in FIG. 9 by the term "$V_{R-}$." The transistor 938 can have its drain node coupled to the drain node of the transistor 933 and to the current mirror circuit 940. The transistors 937 and 938 can have their source nodes coupled to the drain node of the transistor 923 of the bias circuit 920. The differential amplifier 936 can be configured to receive a bias current via the transistor 923 of the bias circuit 920. The differential amplifier 936 can compare the negative differential input signal at the input node 904 and the negative differential reference signal the reference node 906 to provide a second difference signal $(V_{IN-}-V_{R-})$ at the drain node of the transistor 937 and an inverted second difference signal $(-(V_{IN-}-V_{R-})$ at the drain node of the transistor 938. The second difference signal and the inverted second difference signal can each be, for instance, an analog voltage signal.

The first difference signal at the drain node of the transistor 933 can be combined with the inverted second difference signal at the drain node of the transistor 938 to form a difference signal $((V_{IN+}-V_{R+})-(V_{IN-}-V_{R-}))$. Further, the second difference signal at the drain node of the transistor 937 can be combined with the inverted first difference signal at the drain node of the transistor 934 to form an inverted difference signal $(-(V_{IN+}-V_{R+})+(V_{IN-}-V_{R-}))$. The difference signal and inverted difference signal can each be, for instance, an analog voltage signal.

In this embodiment, the current mirror circuit 940 can be configured to include a transistors 941, 942, 943 and 944. In this example, the transistors 941, 942, 943 and 944 can each be a PMOS transistor. However, other types of transistors can be used such as a NMOS transistor, NPN or PNP BJT, N-type or P-type FET, other transistor type, or any combination thereof. The current mirror circuit 940 can be configured to operate by substantially mirroring the current flowing through the transistor 941 in the transistor 943 and by substantially mirroring the current flowing through the transistor 942 in the transistor 944. In this example, the difference signal and inverted difference signal output from the comparator circuit 930 can each be substantially mirrored by the current mirror circuit 940 to the output nodes 907 and 908, respectively. It should be recognized that the current mirror circuit 940 can be configured as two separate current mirrors—a first current mirror can include the transistors 941 and 943, and a second current mirror can include the transistors 942 and 944. While the current mirror circuit 940 can be configured to use two current mirror circuits, other techniques or configurations can be used to perform the same or similar function.

In FIG. 9, the transistor 941 can have its drain node coupled to its gate node, the drain nodes of the transistors 933 and 938 of the comparator circuit 930, and the gate node of the transistor 943. The transistor 942 can have its drain node coupled to its gate node, the drain nodes of the transistors 934 and 937 of the comparator circuit 930, and the gate node of the transistor 944. The transistor 943 can have its drain node coupled to the output node 907, the latch circuit 950, and the memory circuit 960. The transistor 944 can have its drain node coupled to the output node 908, the latch circuit 950, and the memory circuit 960. The transistors 941, 942, 943 and 944 can have their source nodes coupled to the supply voltage source node 901.

In this embodiment, the latch circuit 950 can be configured to include a transistors 951, 952, 953 and 954, used to latch the difference signal and inverted difference signal at the output nodes 907 and 908 to generate a first and second latched signals, respectively. During the regenerate state of the latch circuit 950, the difference signal and inverted difference signal at the output nodes 907 and 908 can latch to different voltage levels on either of the voltage supply source nodes 901 and 902. Alternatively, during the reset state of the latch circuit 950, the voltage levels on the output nodes 907 and 908 can latch to the same voltage level on either of the voltage supply source nodes 901 and 902. In this example, the transistors 951, 952, 953 and 954 can each be an NMOS transistor. However, other types of transistors can be used such as a PMOS transistor, NPN or PNP BJT, N-type or P-type FET, other transistor type, or any combination thereof.

In the current embodiment, the transistors 951 and 952 can be configured as inverters by connecting the input of one transistor to the output of the other transistor. The transistor 951 can have its drain node coupled to the gate node of the transistor 952, the drain node of the transistor 953, the output node 907, and the drain node of the transistor 943 of the current mirror circuit 940. The transistor 952 can have its drain node coupled to the gate node of the transistor 951, the drain node of the transistor 954, the output node 908, and the drain node of the transistor 944 of the current mirror circuit 940. Further, an inverted clock signal node can provide an inverted clock signal, as referenced in FIG. 9 by the term "$\overline{V_{CLK}}$," and can be coupled to the gate of the transistors 953 and 954. Thus, the transistors 953 and 954 can be used to operate the transistors 951 and 952 in synchronization with an inverted clock signal.

In FIG. 9, the memory circuit 960 can be configured to include an inverter logic gates 961 and 962 and a NAND logic gates 965 and 966 to form an SR NAND latch circuit. In other embodiments, the memory circuit 960 can be a flip-flop, latch, SR NOR latch, JK latch, gated SR latch, gated D latch, Earle latch, D flip-flop, T flip-flop, JK flip-flop, RS flip-flop, RAM, another memory circuit or element, or any combination thereof. The inputs to the inverter logic gates 961 and 962 can be the second and first latched signals from the output nodes 908 and 907, respectively. The outputs from the inverter logic gates 961 and 962 are an inverted second latched signal and an inverted first latched signal, referenced in FIG. 9 by the terms "NODEA" and "NODEB," respectively. The outputs from the inverter logic gates 961 and 962 can be input to the NAND logic gates 965 and 966, respectively. Further, the NAND logic gates 965 and 966 can be cross-coupled by connecting each output of the NAND logic gate to the input of the other NAND logic gate. The outputs of the NAND logic gates 965 and 966 are a first and second NAND output signals, referenced in FIG. 9 by the terms "COUTP" and "COUTM," respectively.

In FIG. 9, the control circuit 970 can be configured to include an XOR logic gate 971 and an inverter logic gate 973. The control circuit 970 can generate a control signal that is used to control a bias current provided by the bias circuit 920 to any of the circuits or elements associated with the comparator 900. For example, the control circuit 970 can generate a control signal to control a bias current provided by the bias circuit 920 to place the amplifier circuit, the voltage comparison circuit, the associated comparator circuit 930, or any combination thereof in an active mode, inactive mode, or both. The inputs to the XOR logic gate 971 can be the inverted second latched signal and the inverted first latched signal from the inverter logic gates 961 and 962 of the memory circuit 960, referenced in FIG. 9 by the terms "NODEA" and "NODEB," respectively. The output node of the XOR logic gate 971 can provide an inverted control signal, referenced in FIG. 9 by the term "$\overline{SW}$." Further, the inverted control signal can be input to the inverter logic gate 973 to form a control signal, referenced in FIG. 9 by the term "SW." The control signal, inverted control signal, or both can be input to the switch circuit 980.

In the current embodiment, the switch circuit 980 can be configured to include a switch 981 and a switch 982. The switch circuit 980 can be switched to place the amplifier circuit, the voltage comparison circuit, the associated comparator circuit 930, another circuit or element, or any combination thereof in an active mode, inactive mode, or both by controlling its bias current provided by the bias circuit 920. One end node of the switch 981 can be coupled to the gate node and the drain node of the transistor 921 of the bias circuit 920. The other end node of the switch 981 can be coupled to the gate nodes of the transistors 922 and 923 of the bias circuit 920. The switch 981 can be controlled by the control signal provided at the output node of the inverter logic gate 973 of the control circuit 970, referenced in FIG. 9 by the term "SW." One end node of the switch 982 can be coupled to the other end node of the switch 981 and to the gate nodes of the transistors 922 and 923 of the bias circuit 920. The other end of the switch 982 can be coupled to the voltage supply source node 902. The switch 982 can be controlled by the control signal provided at the output node of the AND logic gate 972 of the control circuit 970, as referenced in FIG. 9 by the term "$\overline{SW}$."

For example, a control signal with a high voltage level, as generated by the control circuit 970, can close the switch 981 and can open the switch 982. Thus, the bias circuit 920 can substantially mirror the current generated by the constant current source circuit 910 in providing a sufficient bias current for the amplifier circuit, the voltage comparison circuit, the associated comparator circuit 930, or any combination thereof, placing such circuit in an active mode. Alternatively, a control signal with a low voltage level can, as generated by the control circuit 970, can open the switch 981 and can close the switch 982. Thus, the bias circuit 920 does not provide a sufficient bias current for the amplifier circuit, the voltage comparison circuit, the associated comparator circuit 930, or any combination thereof, placing such circuit in an inactive mode.

In another example, the constant current provided by the constant current source circuit 910 can be mirrored by the bias circuit 920 in providing a sufficient bias current to the comparator circuit 930 by switching the switch 981 in response to the control signal to couple the gate node of the transistor 921 with the gate nodes of the transistors 922 and 923, and by switching the switch 982 in response to the inverse of said control signal ho decouple the gate nodes of the transistors 922 and 923 from the voltage supply source node 902. Alternatively, the mirroring of the constant current by the bias circuit 920 can be disabled by switching the switch 981 in response to the control signal to decouple the gate node of the transistor 921 from the gate nodes of the transistors 922 and 923, and by switching the switch 982 in response to the inverse of said control signal to couple the gate nodes of the transistors 922 and 923 with the voltage supply source node 902.

In operation, if the inverted clock signal is high ($\overline{V_{CLK}}$=1) at the gate nodes of the transistors 953 and 954, then the latch circuit 950 is operated in a regenerate state. Thus, the latch circuit 950 latches the difference signal at the output node 907 and the inverted difference signal at the output node 908 to the voltage level at either the voltage supply source node 901 or the voltage supply source node 902 resulting in a first and second latched signals, respectively. The first and second latched signals at the output nodes 907 and 908 are input to and stored by the memory circuit 960.

For example, if the voltage level at the input node 903 is greater than the voltage level at the reference node 905 ($V_{IN+}$>$V_{R+}$) and the voltage level at the input node 904 is less than the voltage level at the reference node 906 ($V_{IN-}$<$V_{R-}$), then the latch circuit 950 during regenerate state will latch the voltage level on the output node 907 to the voltage supply source node 902 ($V_{O+}$≈$V_{SS}$) and will latch the voltage level on the output node 908 to the voltage supply source node 901 ($V_{O-}$≈$V_{DD}$). However, if the voltage level at the input node 903 is less than the voltage level of the signal at the reference node 905 ($V_{IN+}$<$V_{R+}$) and the voltage level at the input node 904 is greater than the voltage level at the reference node 906 $V_{IN-}$>$V_{R-}$, then the latch circuit 950 during regenerate state will latch the voltage level on the output node 907 to the voltage supply source node 901 ($V_{O+}$≈$V_{DD}$) and will latch the voltage level on the output node 908 to the voltage supply source node 902 ($V_{O-}$≈$V_{SS}$).

Further, the memory circuit 960 inverts the second and first latched signals using the inverter logic gates 961 and 962 to generate the inverted signals (NODEA=0 and NODEB=1), respectively. Thus, the memory circuit 960 will store a high digital signal (COUTP=1). The control circuit 970 applies a logical XOR operation to the inverted first latched signal and the inverted second latched signal using the XOR logic gate 971 to generate an inverted switch signal, as referenced in FIG. 9 by the term "$\overline{SW}$." The control circuit 970 then inverts the inverted switch signal using the inverter logic gate 973 to generate a switch signal, as referenced in FIG. 9 by the term "SW." It should be recognized that the inverted first latched signal and the inverted second latched signal at the input of the XOR logic gate 971 are inverses of each other (NODEA∝NODEB). Thus, the output of the XOR logic gate 971 generates a high voltage level for the inverted switch signal ($\overline{SW}$=1). Further, the inverter logic gate 972 generates a low voltage level for the switch signal (SW=0).

Alternatively, if the inverted clock signal is low ($\overline{V_{CLK}}$=0), the latch circuit 950 is operated in a reset state. Thus, the latch circuit 950 rapidly settles to about the same voltage level for the first and second latched signals at the output node 907 and the output node 908, respectively. It should be recognized that the inverted first latched signal and the inverted second latched signal at the input of the XOR logic gate 971 are about the same voltage level (NODEA≈NODEB). Thus, the output of the XOR logic gate 971 generates a low voltage level for the inverted switch signal ($\overline{SW}$=0). Further, the inverter logic gate 972 generates a high voltage level for the switch signal (SW=1).

In addition, the switch signal, as referenced in FIG. 9 by the term "SW," and the inverted switch signal, as referenced in FIG. 9 by the term "$\overline{SW}$," control the switch circuit 980. When the switch signal is high (SW=1) and the inverted switch signal is low ($\overline{SW}$=0), the switch 981 is closed and the switch 982 is open; thus, the gate of the transistor 921 is coupled to the gates of the transistors 922 and 923, and the gates of the transistors 922 and 923 are decoupled from the supply voltage source node 982. While in this state, the bias circuit 920 can provide a bias current to the comparator circuit 930 by substantially mirroring the bias current from the constant current source circuit 910 to the comparator circuit 930. Therefore, the comparator circuit 930 is in an active mode resulting in the use of more bias current.

However, when the switch signal is low (SW=0) and the inverted switch signal is high ($\overline{SW}$=1), the switch 981 is open and the switch 982 is closed; thus, the gate of the transistor 921 is decoupled from the gates of the transistors 922 and 923, and the gates of the transistors 922 and 923 are coupled to the voltage supply source node 902. While in this state, the transistors 922 and 923 are in an inactive mode and unable to mirror the constant current. Thus, the bias circuit 920 cannot provide a sufficient bias current to the comparator circuit 930 to place it in an active mode. Therefore, the comparator circuit 930 is in an inactive mode resulting in the use of less bias current.

Although the present disclosure describes specific examples, embodiments, and the like, various modifications and changes can be made without departing from the scope of the present disclosure as set forth in the claims below. For example, although the exemplary methods, devices, and systems described herein are in conjunction with a configuration for the aforementioned comparators, the skilled artisan will readily recognize that the exemplary methods, devices, and systems may be used in other methods, devices, and systems and may be configured to correspond to such other exemplary methods, devices, and systems as needed. Further, while at least one embodiment has been presented in the foregoing detailed description, many variations exist. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all of the claims.

What is claimed is:

1. A method of operating a comparator, comprising:
    providing a bias current;
    comparing an input signal and a reference signal to determine a difference signal and an inverted difference signal;
    latching said difference signal and said inverted difference signal to generate a first and second latched signals;
    generating a control signal using at least said first and second latched signals; and
    controlling said bias current in response to said control signal, wherein said comparing an input signal and a reference signal is activated and deactivated in response to said controlling said bias current, wherein said comparing an input signal and a reference signal is activated when said first latched signal is about the same as said second latched signal and is deactivated when said first latched signal is different from said second latched signal.

2. The method of claim 1, wherein said comparing an input signal and a reference signal is performed by a comparator circuit; and
    wherein said bias current is used to place said comparator circuit in an active mode and an inactive mode.

3. The method of claim 1, wherein said providing a bias current further comprises:
    providing a constant current from an output node of a constant current source circuit to an input node of a bias circuit, wherein said bias circuit provides said bias current;
    wherein said controlling said bias current in response to said control signal further comprises:
        switching a switch in response to said control signal to couple and decouple said output node of said constant current source circuit with said input node of said bias circuit.

4. The method of claim 1, wherein said providing a bias current further comprises:
    mirroring a constant current to provide said bias current;
    wherein said controlling said bias current in response to said control signal further comprises:
        mirroring said constant current in response to said control signal.

5. The method of claim 4, wherein said mirroring a constant current to provide said bias current further comprises:
    mirroring said constant current received by a first transistor in a second transistor; and
    wherein said mirroring said constant current in response to said control signal further comprises:
        switching a first switch in response to said control signal to couple and decouple the gate node of said first transistor with the gate node of said second transistor; and
        switching a second switch in response to the inverse of said control signal to couple and decouple the gate node of said second transistor with a voltage supply source node.

6. The method of claim 4, wherein said mirroring a constant current to provide said bias current further comprises:
    mirroring said constant current received by a first transistor in a second transistor; and
    wherein said mirroring said constant current in response to said control signal further comprises:

switching a switch to couple and decouple the source node of said second transistor with a voltage supply source node.

7. The method of claim 1, wherein said comparing an input signal and a reference signal is performed by a differential amplifier circuit; and wherein said bias current is used to place said differential amplifier circuit in an active mode and an inactive mode.

8. The method of claim 1, wherein said latching said difference signal and said inverted difference signal is performed by a latch circuit, wherein said latch circuit operates in a regenerate state and a reset state; and wherein said comparing an input signal and a reference signal is activated when at least one of said first latched signal is about the same as said second latched signal and said latch circuit is operated in said regenerate state and is deactivated when said first latched signal is different from said second latched signal and said latch circuit is operated in said reset state.

9. The method of claim 1, wherein said comparing an input signal and a reference signal and said latching said difference signal and said inverted difference signal are performed by a latched comparator circuit.

10. A comparator, comprising:
a bias circuit configured to provide a bias current;
a comparator circuit configured to determine a difference signal and an inverted difference signal by comparing an input signal and a reference signal, wherein said bias current is used to place said comparator circuit in an active mode;
a latch circuit configured to latch said difference signal and said inverted difference signal to generate a first and second latched signals;
a control circuit configured to generate a control signal using at least said first and second latched signals; and
a switch circuit configured to use said control signal to control said bias current to place said comparator circuit in an active mode and an inactive mode, wherein said control circuit is further configured to generate said control signal to place said comparator circuit in an active mode when said first latched signal is about the same as said second latched signal and in an inactive mode when said first latched signal is different from said second latched signal.

11. The comparator of claim 10, wherein said input signal comprises a positive and negative differential input signals;
wherein said reference signal comprises a positive and negative reference signals; and
wherein said comparator circuit further comprises:
a first differential amplifier configured to receive said positive differential input signal and said positive reference signal to determine a first difference signal and an inverted first difference signal;
a second differential amplifier configured to receive said negative differential input signal and said negative reference signal to determine a second difference signal and an inverted second difference signal;
wherein said first difference signal and said inverse second difference signal are combined to form said difference signal; and
wherein said inverted first difference signal and said second difference signal are combined to form said inverted difference signal.

12. The comparator of claim 10, wherein said latch circuit operates in a regenerate state and a reset state; and
wherein said control circuit is further configured to generate said control signal to place said comparator circuit in an active mode when at least one of said first latched signal is about the same as said second latched signal and said latch circuit is operated in said regenerate state and in an inactive mode when said first latched signal is different from said second latched signal and said latch circuit is operated in said reset state.

13. The comparator of claim 10, wherein said switch circuit is further configured to couple and decouple the output node of a constant current source with the input node of said bias circuit in response to said control signal, wherein said constant current source is configured to provide a constant current.

14. The comparator of claim 10, wherein said bias circuit further comprises:
a first transistor configured to receive a constant current;
a second transistor configured to provide a bias current, wherein said first transistor mirrors the constant current in said second transistor; and
wherein said switch circuit further comprises:
a first switch configured to couple and decouple the gate node of said first transistor with the gate node of said second transistor in response to said control signal; and
a second switch configured to couple and decouple the gate node of said second transistor with a voltage supply source node in response to the inverse of said control signal.

15. The comparator of claim 10, wherein said bias circuit further comprises:
a first transistor configured to receive a constant current;
a second transistor configured to provide a bias current, wherein said first transistor mirrors the constant current in said second transistor; and
wherein said switch circuit further comprises:
a switch configured to couple and decouple the source node of said second transistor with a voltage supply source node in response to said control signal.

16. An analog-to-digital converter, comprising:
a reference circuit configured to generate a reference signal;
a bias circuit configured to provide a bias current;
a comparator circuit configured to compare said reference signal and an input signal to determine a difference signal and an inverted difference signal, wherein said bias current is used to place said comparator circuit in an active mode;
a latch circuit configured to latch said difference signal and said inverted difference signal to generate a first and second latched signals;
a memory circuit configured to store a digital signal using at least one of said first and second latched signals;
an encoder circuit configured to use said digital signal to generate a data sample;
a control circuit configured to generate a control signal, wherein said control circuit uses at least said first and second latched signals; and
a switch circuit configured to use said control signal to control said bias current to place said comparator circuit in an active mode and an inactive mode, wherein said control circuit is further configured to generate said control signal to place said comparator circuit in an active mode when said first latched signal is about the same as said second latched signal and in an inactive mode when said first latched signal is different from said second latched signal.

17. The analog-to-digital converter of claim 16, wherein said latch circuit operates in a regenerate state and a reset state; and wherein said control circuit is further configured to generate said control signal to place said comparator circuit in an active mode when at least one of said first latched signal is about the same as said second latched signal and said latch circuit is operated in said regenerate state and in an inactive mode when said first latched signal is different from said second latched signal and said latch circuit is operated in said reset state.

* * * * *